(12) United States Patent
Park

(10) Patent No.: US 10,916,403 B2
(45) Date of Patent: Feb. 9, 2021

(54) ION BEAM APPARATUS INCLUDING SLIT STRUCTURE FOR EXTRACTING ION BEAM

(71) Applicant: SAMSUNG ELECTRONICS CO., LTD., Suwon-si (KR)

(72) Inventor: Jongchul Park, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/380,012

(22) Filed: Apr. 10, 2019

(65) Prior Publication Data
US 2019/0237292 A1  Aug. 1, 2019

Related U.S. Application Data

(62) Division of application No. 15/649,327, filed on Jul. 13, 2017, now Pat. No. 10,347,459.

(30) Foreign Application Priority Data

Dec. 6, 2016 (KR) .................... 10-2016-0165206

(51) Int. Cl.
| | |
|---|---|
| H01J 37/147 | (2006.01) |
| H01J 37/317 | (2006.01) |
| H01J 37/305 | (2006.01) |
| H01J 37/08 | (2006.01) |
| H01J 37/04 | (2006.01) |
| H01J 37/15 | (2006.01) |
| H01J 37/32 | (2006.01) |

(52) U.S. Cl.
CPC .......... *H01J 37/1471* (2013.01); *H01J 37/04* (2013.01); *H01J 37/08* (2013.01); *H01J 37/1472* (2013.01); *H01J 37/15* (2013.01); *H01J 37/3053* (2013.01); *H01J 37/32* (2013.01); *H01J 37/32357* (2013.01); *H01J 37/32422* (2013.01); *H01J 37/32513* (2013.01); *H01J 2237/083* (2013.01)

(58) Field of Classification Search
CPC ...... H01J 37/04; H01J 37/141; H01J 37/1471; H01J 37/30; H01J 37/3007; H01J 37/3053; H01J 37/317; H01J 37/32422
See application file for complete search history.

(56) References Cited

U.S. PATENT DOCUMENTS

| | | | |
|---|---|---|---|
| 4,873,445 A | * | 10/1989 | Le Jeune ............... H01J 27/16 250/423 R |
| 7,285,788 B2 | | 10/2007 | Lee et al. |
| 7,329,882 B2 | | 2/2008 | Rathmell et al. |

(Continued)

FOREIGN PATENT DOCUMENTS

KR       10-1419375 B1       7/2014

*Primary Examiner* — Eliza W Osenbaugh-Stewart
(74) *Attorney, Agent, or Firm* — Lee IP Law, P.C.

(57) ABSTRACT

An ion beam apparatus includes a source part generating plasma therein, a process part in which a process using an ion beam is performed, and a slit structure provided between the source part and the process part and extracting the ion beam from the plasma. The slit structure includes at least one electrode structure. The electrode structure has a slit penetrating the electrode structure and extending in a first direction. The ion beam is irradiated onto a substrate at an incident angle through the slit. The incident angle of the ion beam is adjusted by rotating the electrode structure on a rotation axis parallel to the first direction.

7 Claims, 20 Drawing Sheets

(56) References Cited

U.S. PATENT DOCUMENTS

| | | |
|---|---|---|
| 7,511,288 B2 | 3/2009 | Ogata et al. |
| 7,863,587 B2 | 1/2011 | Dang et al. |
| 9,330,885 B2 | 5/2016 | Feldbaum et al. |
| 9,406,495 B2 | 8/2016 | Jiang et al. |
| 9,514,912 B2 | 12/2016 | Biloiu et al. |
| 2007/0045228 A1 | 3/2007 | Kubota et al. |
| 2012/0129325 A1* | 5/2012 | Adibi ................ H01J 37/32412 438/513 |
| 2014/0170795 A1* | 6/2014 | Prabhakar ......... H01J 37/32623 438/57 |
| 2015/0069017 A1 | 3/2015 | Buonodono |
| 2018/0174870 A1* | 6/2018 | Yang ................ H01J 37/32972 |

\* cited by examiner

ION BEAM APPARATUS INCLUDING SLIT STRUCTURE FOR EXTRACTING ION BEAM

CROSS-REFERENCE TO RELATED APPLICATIONS

This is a divisional application based on pending application Ser. No. 15/649,327, filed Jul. 13, 2017, the entire contents of which is hereby incorporated by reference.

Korean Patent Application No. 10-2016-0165206, filed on Dec. 6, 2016, in the Korean Intellectual Property Office, and entitled: Ion Beam Apparatus Including Slit Structure for Extracting Ion Beam, Etching Method Using the Same and Method for Manufacturing Magnetic Memory Device Using the Ion Beam Apparatus, is incorporated herein in its entirety.

BACKGROUND

1. Field

Embodiments relate to an ion beam apparatus including a slit structure for extracting an ion beam, an etching method using the same, and a method for manufacturing a magnetic memory device using the ion beam apparatus.

2. Description of the Related Art

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory devices may emerge as next-generation semiconductor memory devices because of their high-speed and/or non-volatile characteristics.

The magnetic memory device may include a magnetic tunnel junction (MTJ) pattern. The magnetic tunnel junction pattern may include two magnetic layers and an insulating layer disposed between the two magnetic layers. A resistance value of the magnetic tunnel junction pattern may be changed depending on magnetization directions of the two magnetic layers. For example, when the magnetization directions of the two magnetic layers are anti-parallel to each other, the magnetic tunnel junction pattern may have a relatively high resistance value. When the magnetization directions of the two magnetic layers are parallel to each other, the magnetic tunnel junction pattern may have a relatively low resistance value. The magnetic memory device may read/write data using a difference between the resistance values of the magnetic tunnel junction pattern. A physical etching method using an ion beam may be used to form the magnetic tunnel junction pattern.

SUMMARY

In an aspect, an ion beam apparatus may include a source part generating plasma therein, a process part in which a process using an ion beam is performed, and a slit structure provided between the source part and the process part and extracting the ion beam from the plasma. The slit structure may include at least one electrode structure. The electrode structure may have a slit penetrating the electrode structure and extending in a first direction, and the ion beam may be irradiated onto a substrate at an incident angle through the slit. The incident angle of the ion beam may be adjusted by rotating the electrode structure on a rotation axis parallel to the first direction.

In an aspect, an ion beam apparatus may include a source part generating plasma therein, a process part in which a process using an ion beam is performed, a slit structure provided between the source part and the process part and extracting the ion beam from the plasma, and a stage provided in the process part. A substrate may be loaded on the stage. The slit structure may include an electrode plate including a plurality of slits. The plurality of slits may have line shapes when viewed in a plan view. The ion beam may be irradiated onto the substrate at an incident angle through the plurality of slits. The stage may be provided to have a tilt angle with respect to a flat surface of the electrode plate, and the incident angle of the ion beam may be adjusted by adjusting the tilt angle of the stage.

In an aspect, an etching method may include forming an etch target on a substrate, providing a slit structure over the etch target, the slit structure including at least one electrode structure, the electrode structure having a slit, the slit penetrating the electrode structure and extending in a first direction, irradiating an ion beam to a surface of the etch target through the slit structure, the ion beam being irradiated to the surface of the etch target at an incident angle through the slit of the electrode structure, and adjusting the incident angle of the ion beam.

In an aspect, a method for manufacturing a magnetic memory device may include forming a magnetic tunnel junction layer on a substrate, and forming magnetic tunnel junction patterns laterally spaced apart from each other on the substrate by patterning the magnetic tunnel junction layer. The forming of the magnetic tunnel junction patterns may include providing a slit structure over the magnetic tunnel junction layer, the slit structure including at least one electrode structure, the electrode structure having a slit, the slit penetrating the electrode structure and extending in a first direction, irradiating an ion beam to a surface of the magnetic tunnel junction layer through the slit structure, the ion beam being irradiated to the surface of the magnetic tunnel junction layer at an incident angle through the slit of the electrode structure, and adjusting the incident angle of the ion beam.

In an aspect, an ion beam shaper usable with an ion beam apparatus to control an ion beam, may include a plate having a flat surface to face a target and to be parallel with an upper surface of the target and a slit structure including at least one electrode structure having a slit penetrating therethrough and extending in a first direction, the slit structure penetrating the plate, the ion beam to pass through the slit.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, embodiments will be described in detail with reference to the accompanying drawings.

Figure 1:
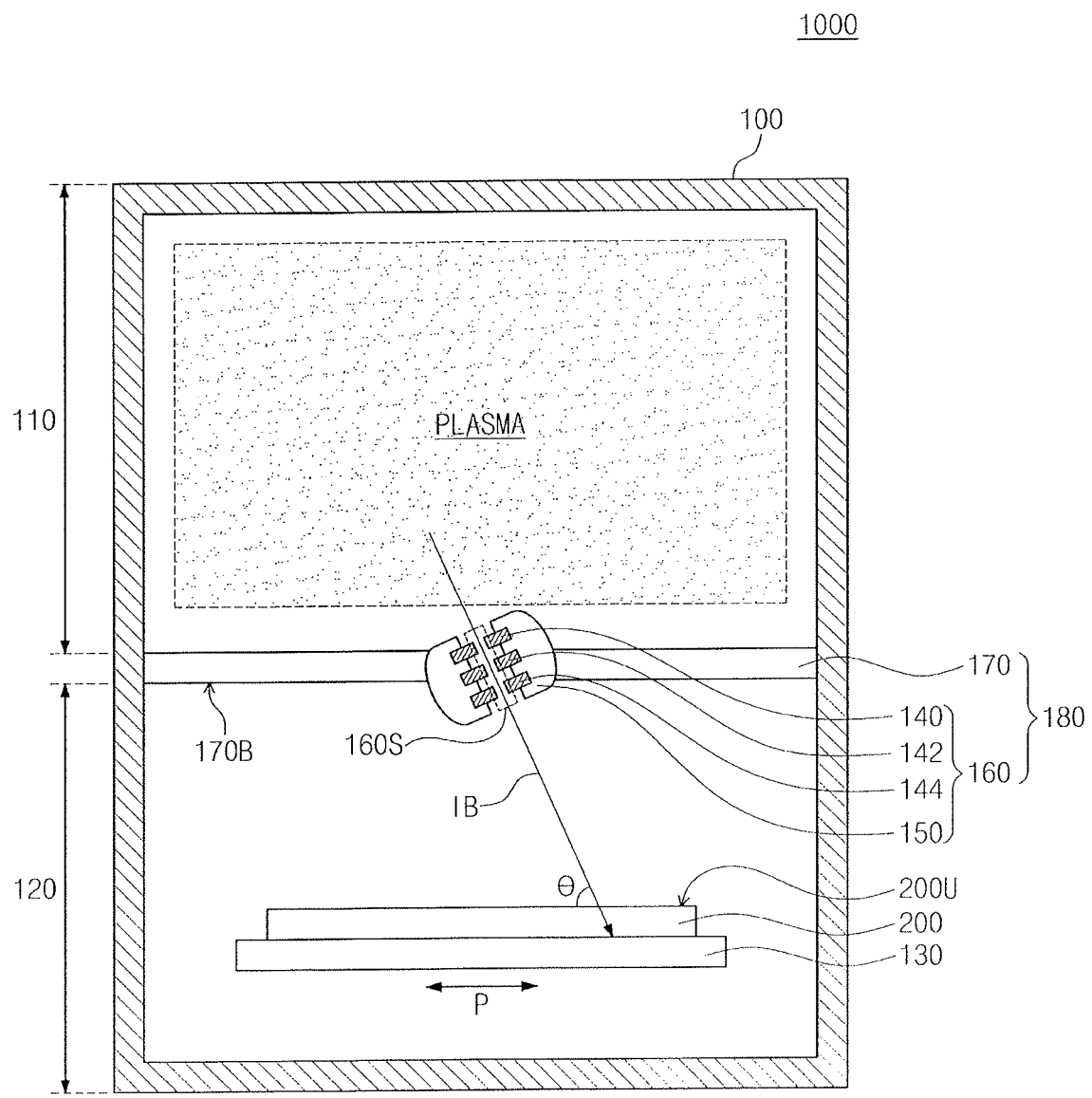
FIG. 1 illustrates a cross-sectional view of an ion beam apparatus according to some embodiments.
Figure 2:
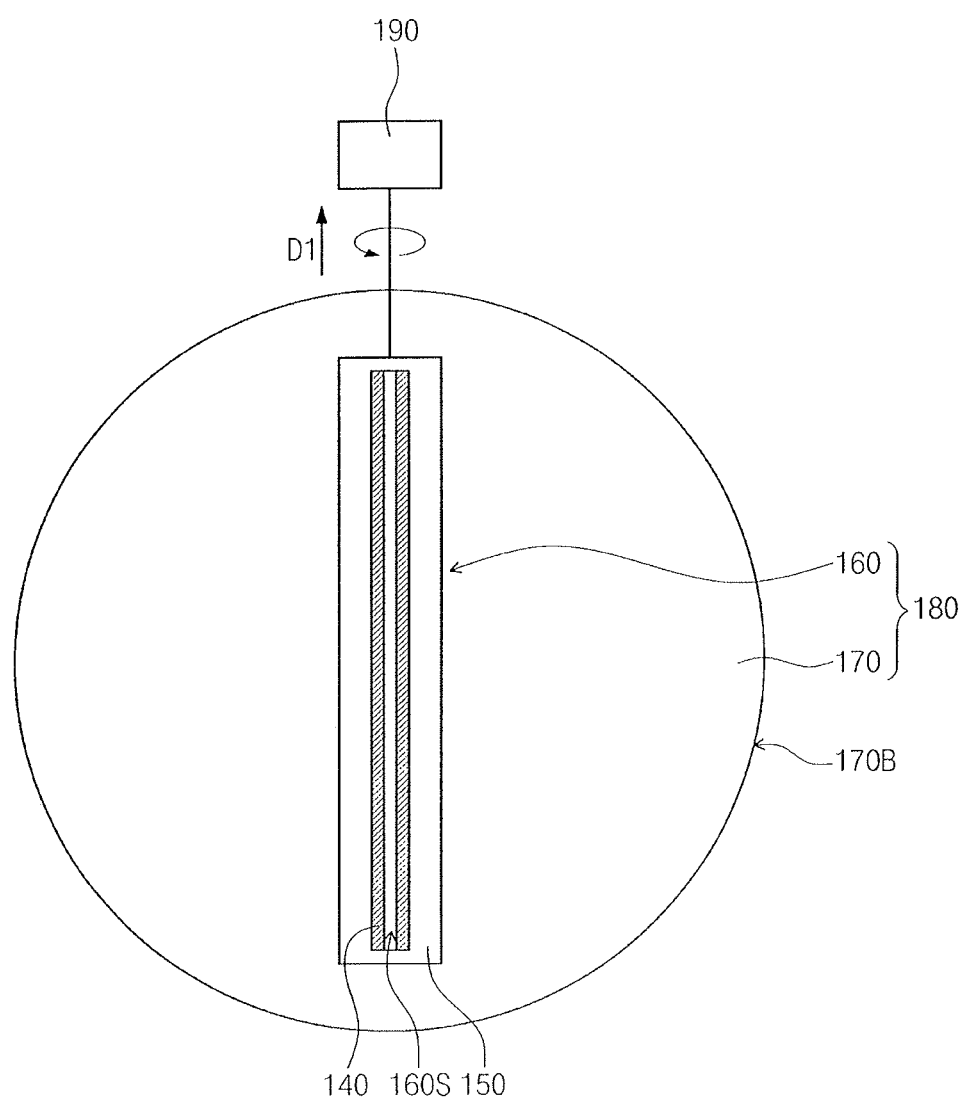
FIG. 2 illustrates a plan view of a slit structure of the ion beam apparatus of FIG. 1.
Figure 3:
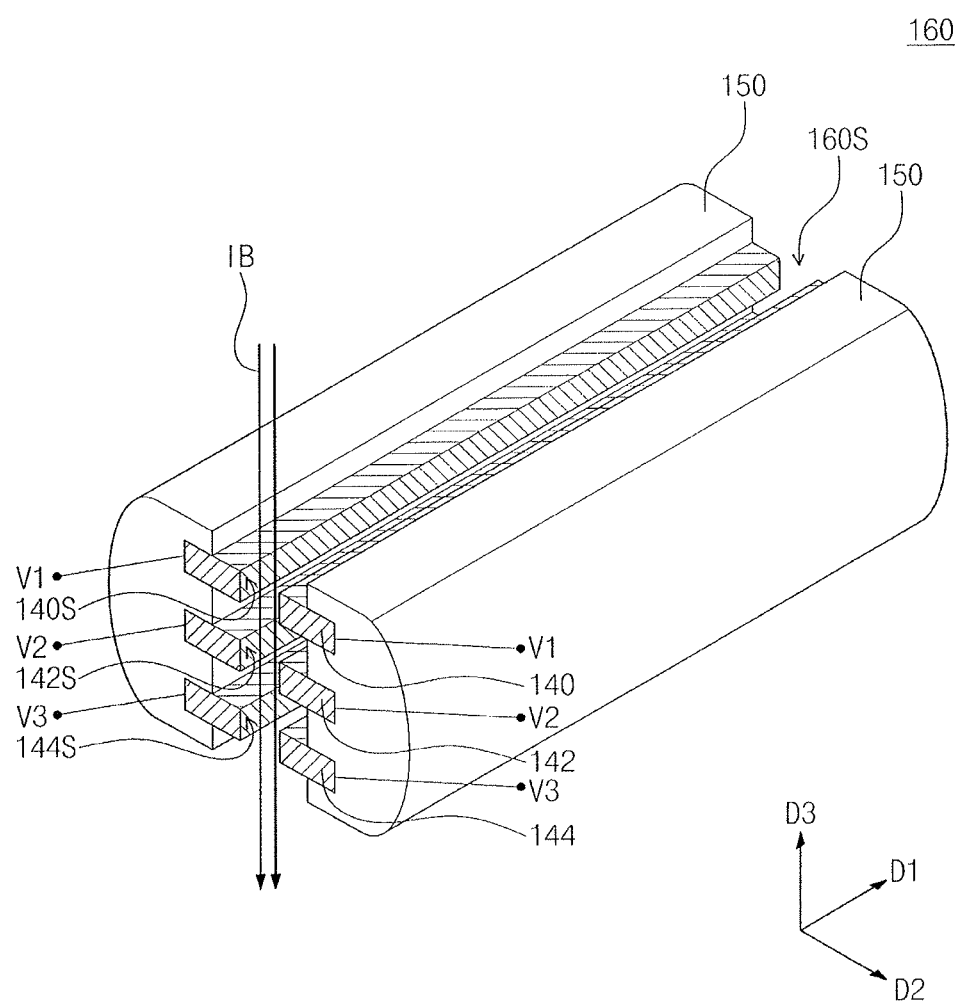
FIG. 3 illustrates a perspective view of an electrode structure included in the slit structure of the ion beam apparatus of FIG. 1.
Figure 4:
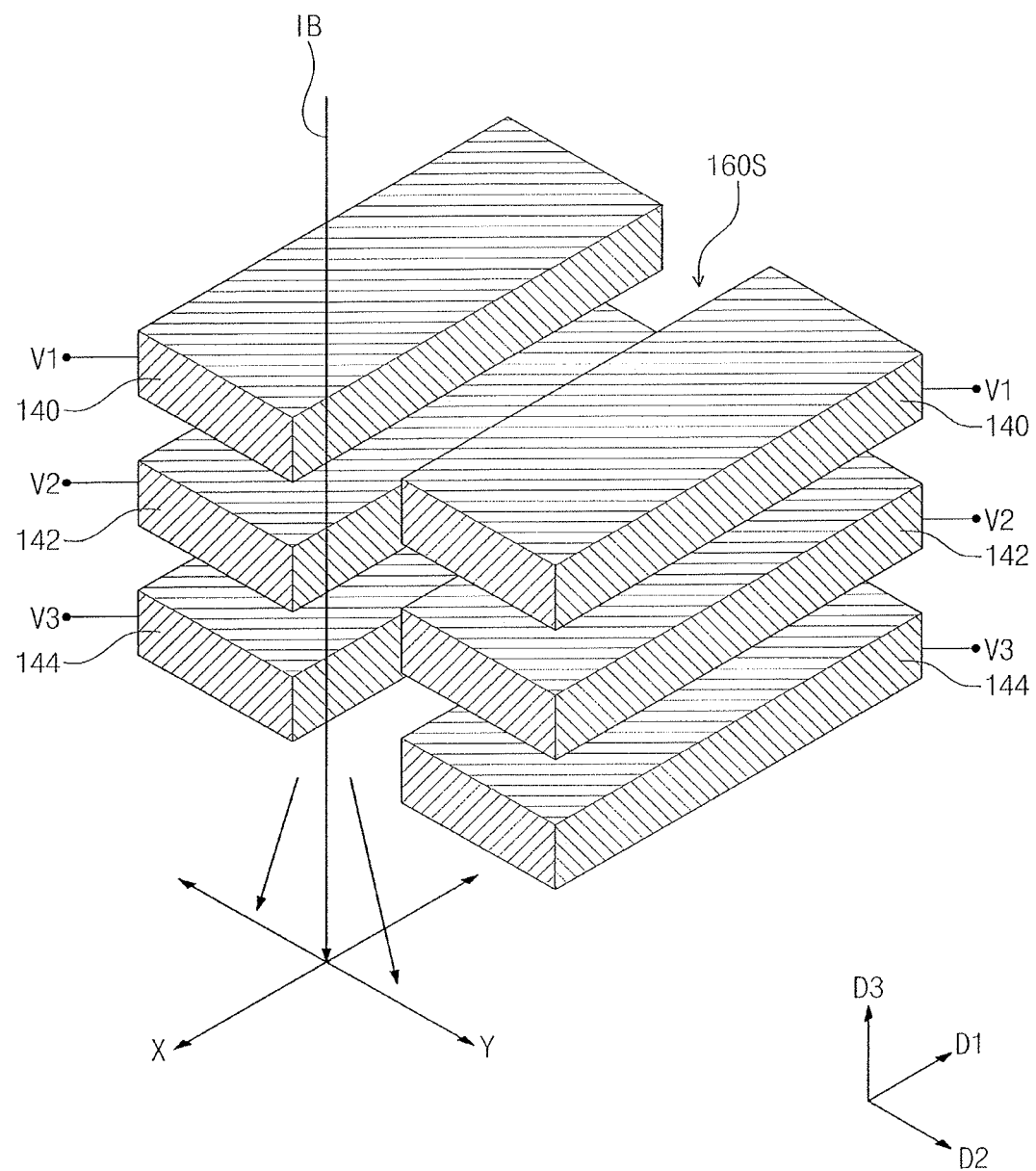
FIG. 4 illustrates a conceptual view of beam divergence of an ion beam extracted by the slit structure of the ion beam apparatus of FIG. 1.

FIG. 1 is a cross-sectional view illustrating an ion beam apparatus according to some embodiments, and FIG. 2 is a plan view illustrating a slit structure of the ion beam apparatus of FIG. 1. FIG. 3 is a perspective view illustrating an electrode structure included in the slit structure of the ion beam apparatus of FIG. 1. FIG. 4 is a conceptual view illustrating beam divergence of an ion beam extracted by the slit structure of the ion beam apparatus of FIG. 1.

Referring to FIG. 1, an ion beam apparatus 1000 may include a chamber 100 in which a process using an ion beam IB is performed. The chamber 100 may include a source part 110 generating plasma and a process part 120 performing the process using the ion beam IB extracted from the plasma. The ion beam apparatus 1000 may include a stage 130 provided in the process part 120 of the chamber 100. A substrate 200 or etch target provided into the chamber 100 may be loaded on the stage 130. The ion beam apparatus 1000 may include a slit structure 180 in the chamber 100 between the source part 110 and the process part 120. The slit structure 180 may extract the ion beam IB from the plasma, e.g., may serve as an ion beam shaper. The ion beam IB may be irradiated or provided onto the substrate 200 through the slit structure 180.

Referring to FIGS. 1 and 2, the slit structure 180 may include a plate part 170 between the source part 110 and the process part 120, and at least one electrode structure 160 penetrating the plate part 170. The source part 110 and the process part 120 may be separated from each other by the plate part 170. The plate part 170 may be disposed in such a way that a flat surface 170B of the plate part 170 is substantially parallel to an upper surface 200U of the substrate 200 (or an upper surface of the stage 130). The flat surface 170B of the plate part 170 may have a shape corresponding to an outer circumferential surface of the chamber 100 when viewed in a plan view. For example, as illustrated in FIG. 2, the flat surface 170B of the plate part 170 may have a circular shape when viewed in a plan view. However, embodiments are not limited thereto. The plate part 170 may be an insulator.

Referring to FIG. 3, the electrode structure 160 may have a line shape extending in a first direction D1, e.g., is longer in the first direction D1 than a second direction D2. The electrode structure 160 may have a slit 160S that penetrates the electrode structure 160, e.g., along a third direction D3, and extends in the first direction D1. The electrode structure 160 may extract the ion beam IB from the plasma, and the ion beam IB may be irradiated or provided onto the substrate 200 through the slit 160S.

In detail, the electrode structure 160 may include a pair of first electrodes 140 laterally spaced apart from each other and a pair of second electrodes 142 laterally spaced apart from each other. The pair of first electrodes 140 may be spaced apart from each other in the second direction D2 intersecting the first direction D1. The pair of second electrodes 142 may also be spaced apart from each other in the second direction D2. The first direction D1 and the second direction D2 may be in the same plane. The pair of second electrodes 142 may vertically overlap the pair of first electrodes 140. In other words, the pair of second electrodes 142 may overlap with the pair of first electrodes 140 in the third direction D3 perpendicular to the first and second directions D1 and D2.

Each of the pair of first electrodes 140 may have a line shape, e.g., a straight line, extending in the first direction D1 and a first slit 140S extending in the first direction D1 may be defined between the pair of first electrodes 140. Likewise, each of the pair of second electrodes 142 may have a line shape, e.g., a straight line, extending in the first direction D1 and a second slit 142S extending in the first direction D1 may be defined between the pair of second electrodes 142. Each of the pair of second electrodes 142 may vertically overlap, e.g., along the third direction D3, a corresponding one of the pair of first electrodes 140 and the second slit 142S may vertically overlap, e.g., along the third direction D3, the first slit 140S. The first and second slits 142S and 140S may define the slit 160S. A first voltage V1 may be applied to the pair of first electrodes 140, and a second voltage V2 different from the first voltage V1 may be applied to the pair of second electrodes 142. By an electric field induced by the pair of first electrodes 140 and the pair of second electrodes 142, the ion beam IB may be extracted from the plasma and may be accelerated into the process part 120. The ion beam IB may be irradiated or provided to the upper surface 200U of the substrate 200 through the slit 160S (i.e., the first slit 140S and the second slit 142S).

The electrode structure 160 may further include a pair of third electrodes 144 laterally spaced apart from each other. The pair of third electrodes 144 may be spaced apart from each other in the second direction D2. The pair of third electrodes 144 may vertically overlap with the pair of first electrodes 140, and the pair of second electrodes 142 may be disposed between the pair of third electrodes 144 and the pair of first electrodes 140. The pair of third electrodes 144 may overlap the pair of first electrodes 140 and the pair of second electrodes 142 in the third direction D3. Each of the pair of third electrodes 144 may have a line shape, e.g., a straight line, extending in the first direction D1, and a third slit 144S extending in the first direction D1 may be defined between the pair of third electrodes 144. Each of the pair of third electrodes 144 may vertically overlap with a corresponding one of the pair of first electrodes 140 and a corresponding one of the pair of second electrodes 142. The third slit 144S may vertically overlap with the first slit 140S and the second slit 142S to define the slit 160S. A third voltage V3 may be applied to the pair of third electrodes 144. The third voltage V3 may be different from the first and second voltages V1 and V2.

In some embodiments, the first voltage V1 may be a positive voltage, the second voltage V2 may be a negative voltage, and the third voltage V3 may be a ground voltage. By an electric field induced by the pair of first electrodes 140, the pair of second electrodes 142 and the pair of third electrodes 144, the ion beam IB may be extracted from the plasma and may be accelerated into the process part 120. The ion beam IB may be irradiated or provided to the upper surface 200U of the substrate 200 through the slit 160S (i.e., the first to third slits 140S, 142S, and 144S).

The electrode structure 160 may further include a pair of insulators 150 laterally spaced apart from each other. The pair of insulators 150 may be spaced apart from each other in the second direction D2. The pair of first electrodes 140, the pair of second electrodes 142, and the pair of third electrodes 144 may be between the pair of insulators 150. Each of the pair of insulators 150 may be coupled to an end portion of a corresponding one of the pair of first electrodes 140, an end portion of a corresponding one of the pair of second electrodes 142, and an end portion of a corresponding one of the pair of third electrodes 144. Each of the pair of insulators 150 may have a line shape extending in the first direction D1. In some embodiments, the pair of insulators 150 may correspond to portions of a single insulator, as illustrated in FIG. 2. Further, as seen in FIG. 3, each of the pair of insulators may generally be a semicylinder with end portions of the electrodes inserted therein on the flat surface thereof.

Referring again to FIGS. 1 and 2, the electrode structure 160 may be provided in the plate part 170 in such a way that a longitudinal direction (i.e., the first direction D1) of the electrode structure 160 is parallel to the flat surface 170B of the plate part 170. The electrode structure 160 may be controlled to rotate on a rotation axis parallel to the first direction D1. In some embodiments, as illustrated in FIG. 2, a motor 190 may be connected to one end of the electrode structure 160, and the electrode structure 160 may be rotated by the motor 190. The electrode structure 160 may rotate in a clockwise direction or a counterclockwise direction on the rotation axis parallel to the first direction D1. An incident angle θ of the ion beam IB may be controlled or adjusted by the rotation of the electrode structure 160. The incident angle θ may be defined as an angle between the upper surface 200U of the substrate 200 (or the upper surface of the stage 130) and an incident direction (or an irradiation direction) of the ion beam IB.

When the process using the ion beam IB is performed in the process part 120, the ion beam IB may be irradiated to the upper surface 200U of the substrate 200 through the slit 160S extending in the first direction D1. As illustrated in FIG. 4, when the ion beam IB is irradiated to the upper surface 200U of the substrate 200 through the slit 160S, the ion beam IB passing through the slit 160S may diverge in a single direction (e.g., a Y-direction). On the other hand, if the ion beam IB is irradiated to the upper surface 200U of the substrate 200 through a hole, e.g., a symmetric opening, the ion beam IB passing through the hole may diverge in multiple directions (e.g., the Y-direction and an X-direction). In other words, the divergence of the ion beam IB passing through the slit 160S may be less than the divergence of the ion beam IB passing through the hole. Thus, according to the embodiments, a beam flux of the ion beam IB irradiated to the upper surface 200U of the substrate 200 may be increased to improve the process capability of the process using the ion beam IB.

During the process using the ion beam IB, the stage 130 may change a horizontal position of the substrate 200 along a direction (i.e., a P-direction) parallel to the upper surface 200U of the substrate 200. Thus, the ion beam IB may scan the upper surface 200U of the substrate 200 along the P-direction. In addition, during the process using the ion beam IB, the stage 130 may rotate the substrate 200 on a rotation axis perpendicular to the upper surface 200U of the substrate 200. Since the upper surface 200U of the substrate 200 is substantially parallel to the flat surface 170B of the plate part 170, a volume of the chamber 100 may be reduced. Thus, it may be easy to maintain an inner space of the chamber 100 at a predetermined pressure. Furthermore, the electrode structure 160 may rotate on the rotation axis parallel to the flat surface 170B of the plate part 170 (i.e., on the rotation axis parallel to the first direction DD. Thus, the incident angle θ of the ion beam may be easily controlled or adjusted during the process.

Figure 5:
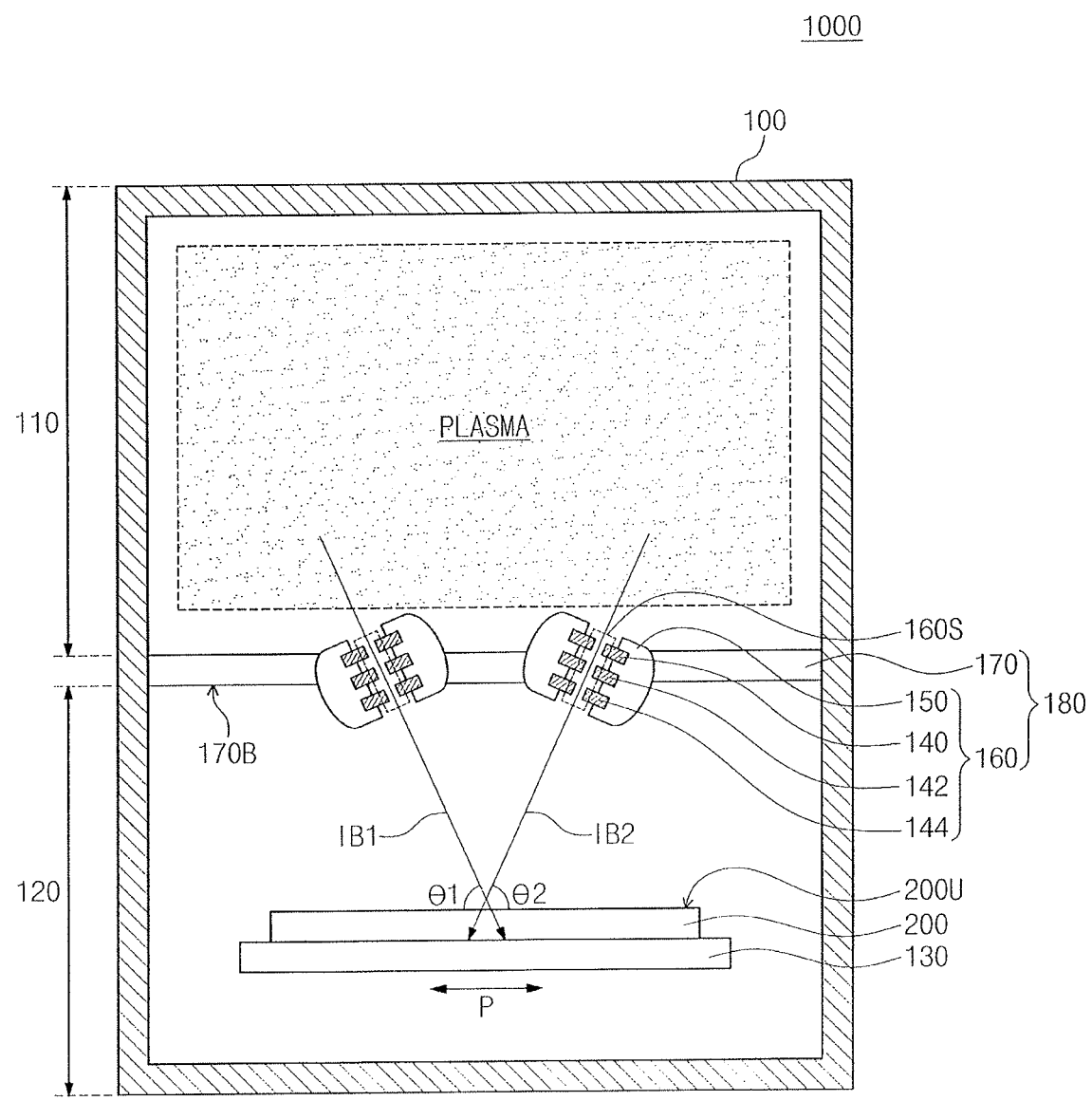
FIG. 5 illustrates a cross-sectional view of an ion beam apparatus according to some embodiments.
Figure 6:
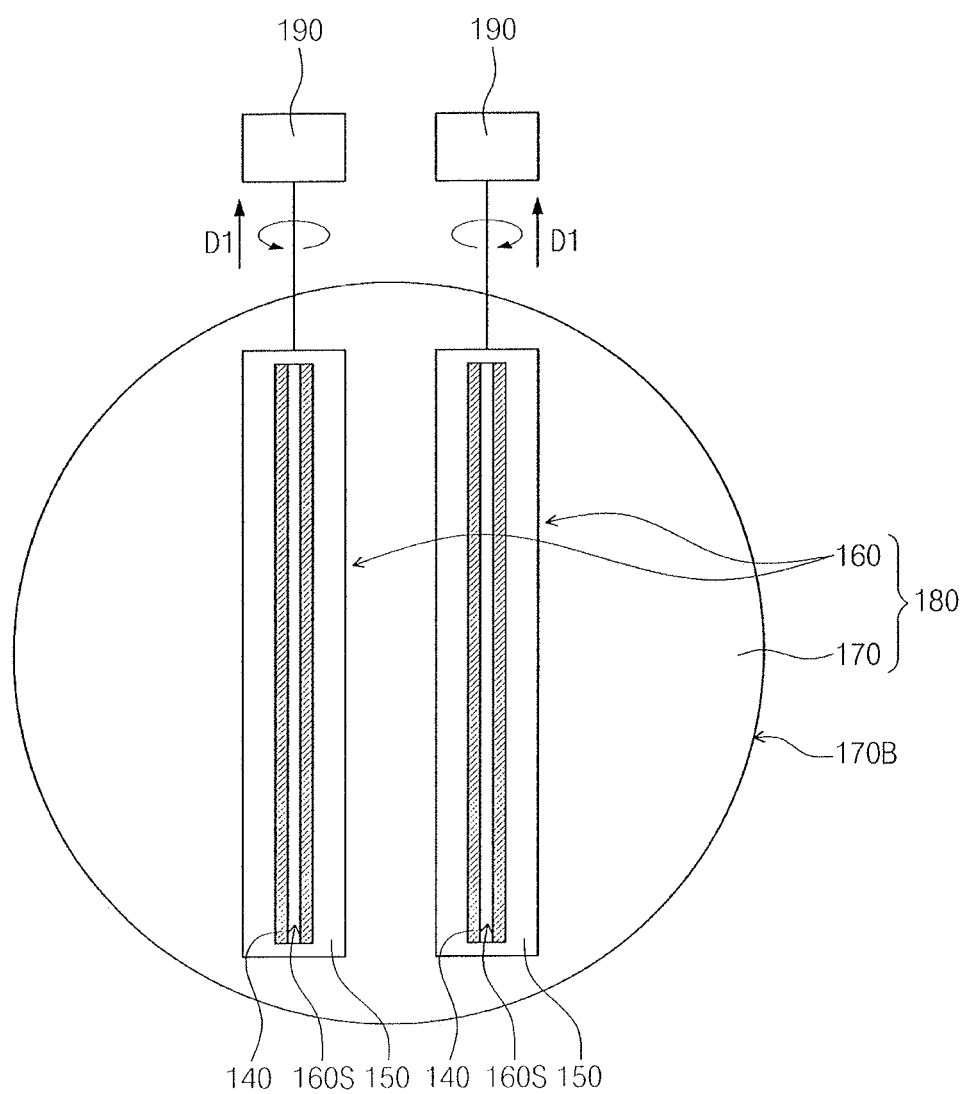
FIG. 6 illustrates a plan view of a slit structure of the ion beam apparatus of FIG. 5.

FIG. 5 is a cross-sectional view illustrating an ion beam apparatus according to some embodiments, and FIG. 6 is a plan view illustrating a slit structure of the ion beam apparatus of FIG. 5. Hereinafter, differences between the present embodiment and the above embodiment of FIGS. 1 to 4 will be mainly described for the purpose of ease and convenience in explanation.

Referring to FIGS. 5 and 6, the slit structure 180 may include the plate part 170 disposed between the source part 110 and the process part 120, and a pair of electrode structures 160 penetrating the plate part 170. The plate part 170 may be disposed in such a way that the flat surface 170B of the plate part 170 is substantially parallel to the upper surface 200U of the substrate 200. Each of the pair of electrode structures 160 may be substantially the same as the electrode structure 160 described with reference to FIG. 3. Each of the pair of electrode structures 160 may be provided in the plate part 170 in such a way that the longitudinal direction (i.e., the first direction D1) of each of the pair of electrode structures 160 is parallel to the flat surface 170B of the plate part 170. The pair of electrode structures 160 may be arranged in a direction which is parallel to the flat surface 170B of the plate part 170 and intersects the first direction D1. Each of the pair of electrode structures 160 may be controlled to rotate on a rotation axis parallel to the first direction D1. As illustrated in FIG. 6, a corresponding motor 190 may be connected to one end of each of the pair of electrode structures 160. Each of the pair of electrode structures 160 may be rotated by the corresponding motor 190. One of the pair of electrode structures 160 may rotate in a clockwise direction on its rotation axis parallel to the first direction D1, and the other of the pair of electrode structures 160 may rotate in a counterclockwise direction on its rotation axis parallel to the first direction D1.

When a process using the ion beam IB is performed in the process part 120, the ion beam IB may include a first ion beam IB1 and a second ion beam IB2. The first ion beam IB1 may be irradiated to the substrate 200 through the slit 160S of one of the pair of electrode structures 160, and the second ion beam IB2 may be irradiated to the substrate 200 through the slit 160S of the other of the pair of electrode structures 160. The pair of electrode structures 160 may rotate in directions opposite to each other on the rotation axes parallel to the first direction D1, and thus the first ion beam IB1 and the second ion beam IB2 may be symmetrically irradiated. The first ion beam IB1 may be irradiated at a first incident angle θ1 with respect to the upper surface 200U of the substrate 200 and the second ion beam IB2 may be irradiated at a second incident angle may be surface 200U of the substrate 200. A magnitude of the first incident angle θ1 may be equal to a magnitude of the second incident angle θ2, and the first ion beam IB1 and the second ion beam IB2 may be bilaterally symmetrically irradiated.

Figure 7:
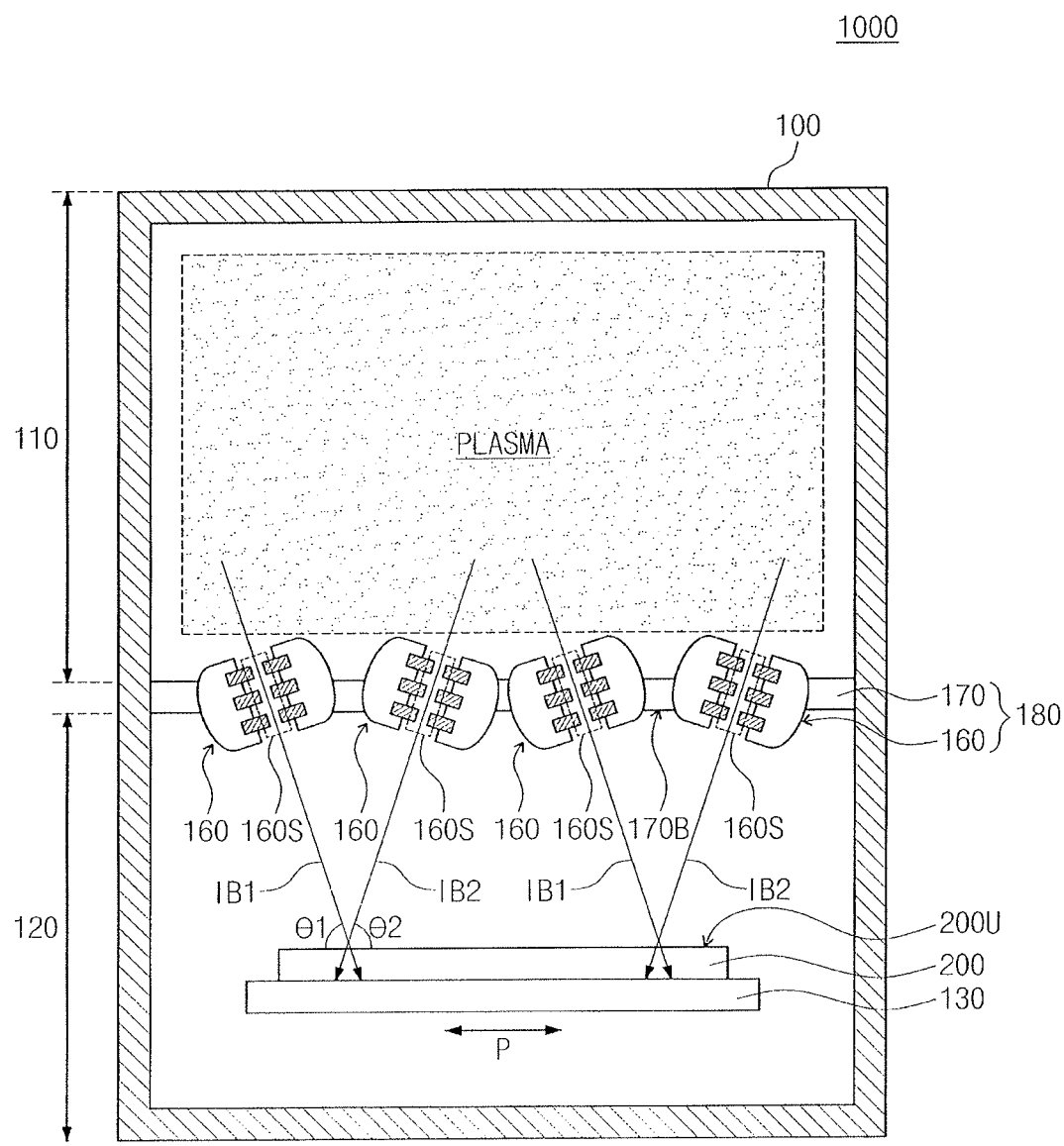
FIG. 7 illustrates a cross-sectional view of an ion beam apparatus according to some embodiments.
Figure 8:
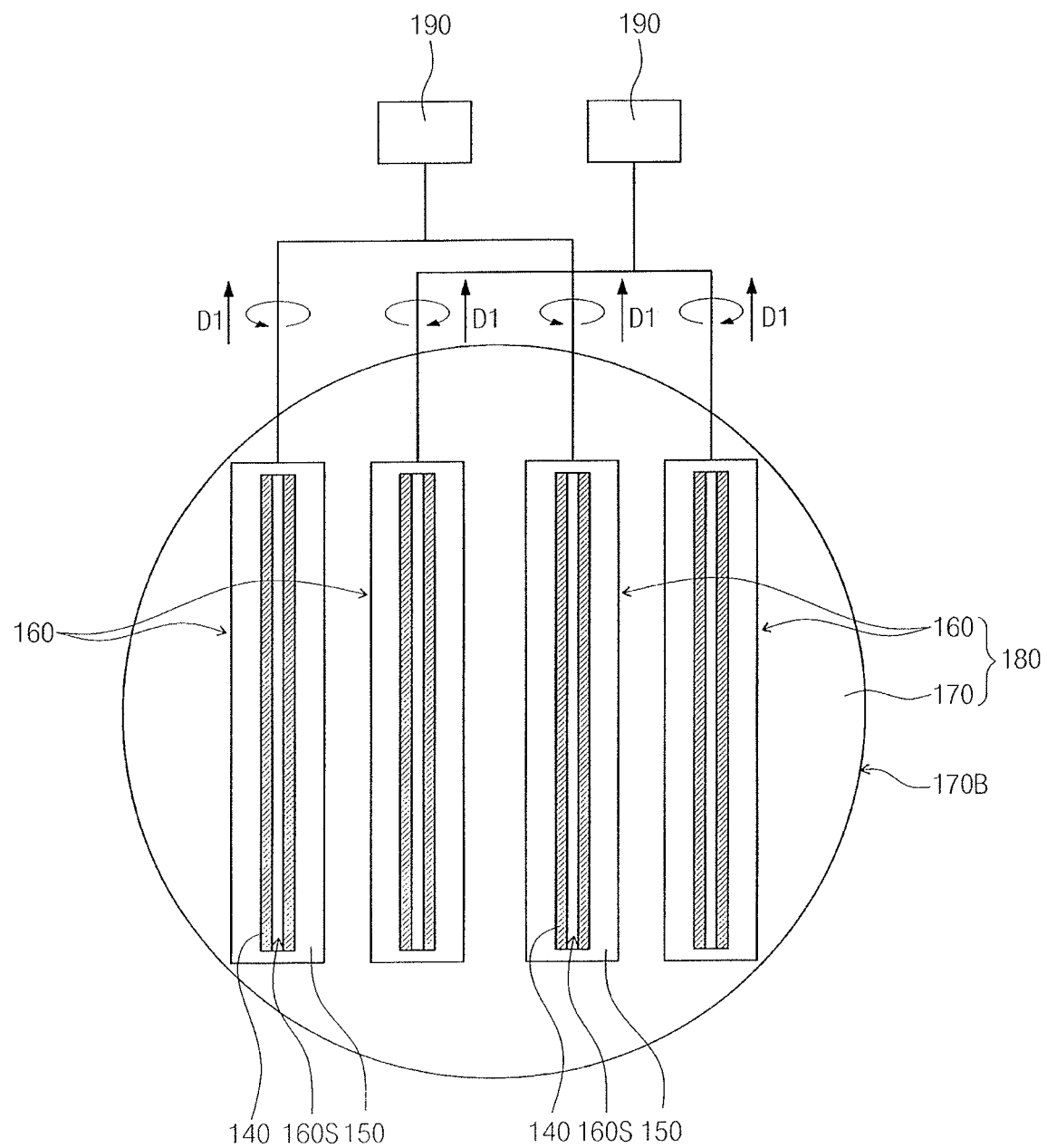
FIG. 8 illustrates a plan view of a slit structure of the ion beam apparatus of FIG. 7.

FIG. 7 is a cross-sectional view illustrating an ion beam apparatus according to some embodiments. FIG. 8 is a plan view illustrating a slit structure of the ion beam apparatus of FIG. 7. Hereinafter, differences between the present embodiment and the above embodiment of FIGS. 1 to 4 will be mainly described for the purpose of ease and convenience in explanation.

Referring to FIGS. 7 and 8, the slit structure 180 may include the plate part 170 between the source part 110 and the process part 120, and a plurality of electrode structures 160 penetrating the plate part 170. The plate part 170 may be disposed in such a way that the flat surface 170B of the plate part 170 is substantially parallel to the upper surface 200U of the substrate 200. Each of the plurality of electrode structures 160 may be substantially the same as the electrode structure 160 described with reference to FIG. 3. Each of the plurality of electrode structures 160 may be provided in the plate part 170 in such a way that the longitudinal direction (i.e., the first direction D1) of each of the plurality of electrode structures 160 is parallel to the flat surface 170B of the plate part 170. The plurality of electrode structures 160 may be arranged in the direction which is parallel to the flat surface 170B of the plate part 170 and intersects the first direction D1. Each of the plurality of electrode structures 160 may be controlled to rotate on a rotation axis parallel to the first direction D1.

As illustrated in FIG. 8, a corresponding motor 190 may be connected to one end of each of the plurality of electrode structures 160, and each of the plurality of electrode structures 160 may be rotated by the corresponding motor 190. Each of odd-numbered electrode structures 160 among the plurality of electrode structures 160 may rotate in a counterclockwise direction on its rotation axis parallel to the first direction D1 and each of even-numbered electrode structures 160 among the plurality of electrode structures 160 may rotate in a clockwise direction on its rotation axis parallel to the first direction D1.

When a process using the ion beam IB is performed in the process part 120, the ion beam IB may include first ion beam IB1 and second ion beam IB2. The first ion beam IB1 may be irradiated to the substrate 200 through the slit 160S of each of the odd-numbered electrode structures 160, and the second ion beam IB2 may be irradiated to the substrate 200 through the slit 160S of each of the even-numbered electrode structures 160. Since the odd-numbered electrode structures 160 rotate in a direction opposite to the rotation directions of the even-numbered electrode structures 160, the first ion beam IB1 and the second ion beam IB2 may be symmetrically irradiated. The first ion beam IB1 may be irradiated at a first incident angle θ1 with respect to the upper surface 200U of the substrate 200, and the second ion beam IB2 may be irradiated at a second incident angle θ2 with respect to the upper surface 200U of the substrate 200. A magnitude of the first incident angle θ1 and the second incident angle θ2 may be equal such that the first ion beam IB1 and the second ion beam IB2 may be bilaterally symmetrically irradiated.

According to the present embodiment, the electrode structures 160 adjacent to each other may rotate in directions opposite to each other. Thus, symmetrical ion beams may be provided to the substrate 200. In other words, the incident direction and the incident angle of the ion beam IB may be easily controlled.

Figure 9:
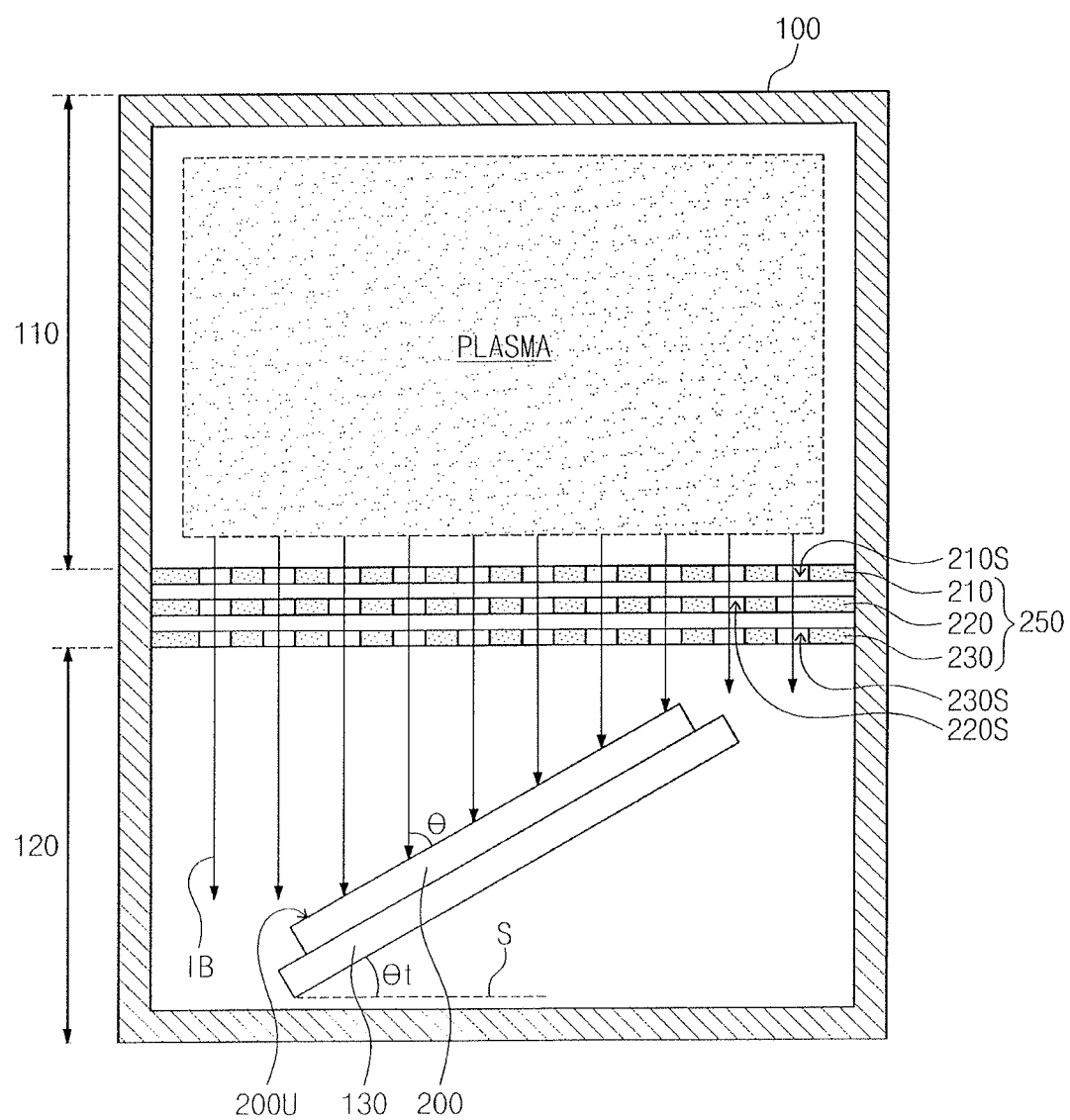
FIG. 9 illustrates a cross-sectional view of an ion beam apparatus according to some embodiments.
Figure 10:
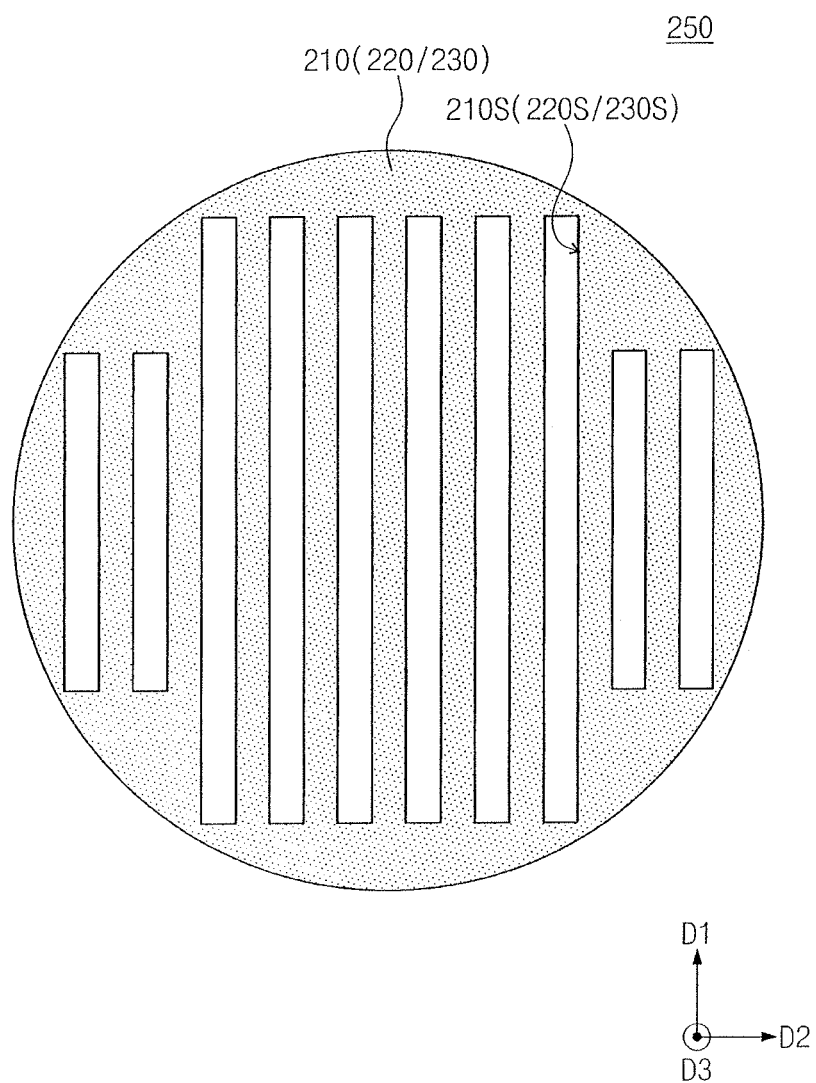
FIG. 10 illustrates a plan view of a slit structure of the ion beam apparatus of FIG. 9.
Figure 11:
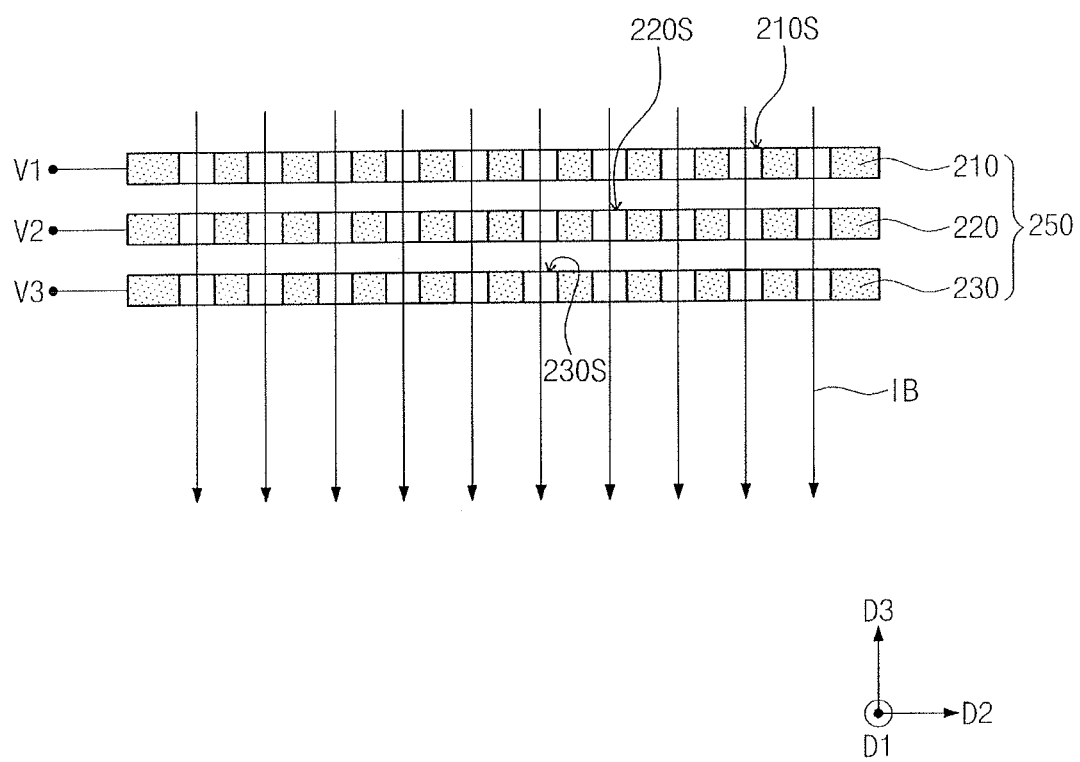
FIG. 11 illustrates a cross-sectional view of the slit structure of the ion beam apparatus of FIG. 9.

FIG. 9 is a cross-sectional view illustrating an ion beam apparatus according to some embodiments. FIG. 10 is a plan view illustrating a slit structure of the ion beam apparatus of FIG. 9. FIG. 11 is a cross-sectional view illustrating the slit structure of the ion beam apparatus of FIG. 9. Hereinafter, the same elements as described in the embodiments of FIGS. 1 to 8 will be indicated by the same reference numerals or the same reference designators, and the descriptions thereto will be omitted or mentioned briefly for the purpose of ease and convenience in explanation.

Referring to FIG. 9, an ion beam apparatus 1100 may include the chamber 100 in which a process using an ion beam IB is performed. The chamber 100 may include the source part 110 generating plasma and the process part 120 performing the process using the ion beam IB extracted from the plasma. The ion beam apparatus 1100 may include a stage 130 provided in the process part 120 of the chamber 100. The substrate 200 provided into the chamber 100 may be loaded on the stage 130. The ion beam apparatus 1100 may include a slit structure 250 in the chamber 100 and between the source part 110 and the process part 120. The slit structure 250 may extract the ion beam IB from the plasma. The ion beam IB may be irradiated or provided onto the substrate 200 through the slit structure 250.

Referring to FIGS. 10 and 11, the slit structure 250 may include a first electrode plate 210 having a plurality of first slits 210S and a second electrode plate 220 having a plurality of second slits 220S. Each of the first slits 210S may have a line shape, e.g., a straight line, extending in a first direction D1 when viewed in a plan view. The first slits 210S may be spaced apart from each other and be arranged in a second direction D2 intersecting the first direction D1 when viewed in a plan view. Likewise, each of the second slits 220S may have a line shape, e.g., a straight line, extending in the first direction D1 when viewed in a plan view. The second slits 220S may be spaced apart from each other and be arranged in the second direction D2 when viewed in a plan view. The second electrode plate 220 may vertically overlap the first electrode plate 210, and each of the second slits 220S may vertically overlap a corresponding one of the first slits 210S. In other words, the second electrode plate 220 may overlap the first electrode plate 210 in a third direction D3 perpendicular to the first and second directions D1 and D2, and each of the second slits 220S may overlap the corresponding one of the first slits 210S in the third direction D3.

As illustrated in FIG. 10, the first and second electrode plates 210 and 220 may have circular plane shapes when viewed in a plan view. However, embodiments are not limited thereto. Each of the first and second electrode plates 210 and 220 may be an electric conductor. A first voltage V1 may be applied to the first electrode plate 210, and a second voltage V2 different from the first voltage V1 may be applied to the second electrode plate 220. By an electric field induced by the first and second electrode plates 210 and 220, the ion beam IB may be extracted from the plasma and may be accelerated into the process part 120. The ion beam IB may be irradiated or provided to the upper surface 200U of the substrate 200 through the first slits 210S and the second slits 220S.

The slit structure 250 may further include a third electrode plate 230 having a plurality of third slits 230S. Each of the third slits 230S may have a line shape, e.g., a straight line, extending in the first direction D1 when viewed in a plan view. The third slits 230S may be spaced apart from each other and be arranged in the second direction D2 when viewed in a plan view. The third electrode plate 230 may vertically overlap with the first electrode plate 210 and the second electrode plate 220. The second electrode plate 220 may be disposed between the first electrode plate 210 and the third electrode plate 230. Each of the third slits 230S may vertically overlap with a corresponding one of the first slits 210S and a corresponding one of the second slits 220S. In other words, the third electrode plate 230 may overlap with the first electrode plate 210 and the second electrode plate 220 in the third direction D3, and each of the third slits 230S may overlap with the corresponding one of the first slits 210S and the corresponding one of the second slits 220S in the third direction D3. The third electrode plate 230 may have a circular plane shape when viewed in a plan view. However, embodiments are not limited thereto. The third electrode plate 230 may be an electric conductor. A third voltage V3 may be applied to the third electrode plate 230. The third voltage V3 may be different from the first and second voltages V1 and V2. In some embodiments, the first voltage V1 may be a positive voltage, the second voltage V2 may be a negative voltage, and the third voltage V3 may be a ground voltage. By an electric field induced by the first to third electrode plates 210, 220 and 230, the ion beam IB may be extracted from the plasma and may be accelerated into the process part 120. The ion beam IB may be irradiated or provided to the upper surface 200U of the substrate 200 through the first slits 210S, the second slits 220S, and the third slits 230S.

Referring again to FIG. 9, the stage 130 may be tilted with respect to a plane S parallel to the first and second directions D1 and D2. The stage 130 may have a tilt angle θt with respect to the plane S, and an incident angle θ of the ion beam IB may be adjusted by adjusting the tilt angle θt of the stage 130. The incident angle θ of the ion beam IB may be defined as an angle between the upper surface 200U of the substrate 200 (or the upper surface of the stage 130) and an incident direction (or an irradiation direction) of the ion beam IB.

When the process using the ion beam IB is performed in the process part 120, the ion beam IB may be irradiated to the upper surface 200U of the substrate 200 through the first to third slits 210S, 220S and 230S extending in the first direction D1. As described with reference to FIG. 4, when the ion beam IB is irradiated to the upper surface 200U of the substrate 200 through the first to third slits 210S, 220S and 230S, the ion beam IB passing through the first to third slits 210S, 220S and 230S may diverge in a single direction (e.g., the Y-direction). In other words, the divergence of the ion beam IB passing through the first to third slits 210S, 220S and 230S according embodiments may be less than the divergence of an ion beam passing through holes. Thus, a beam flux of the ion beam IB irradiated to the upper surface 200U of the substrate 200 may be increased to improve the process capability of the process using the ion beam IB. During the process using the ion beam IB, the stage 130 may rotate the substrate 200 on a rotation axis perpendicular to the upper surface 200U of the substrate 200.

Figure 12:
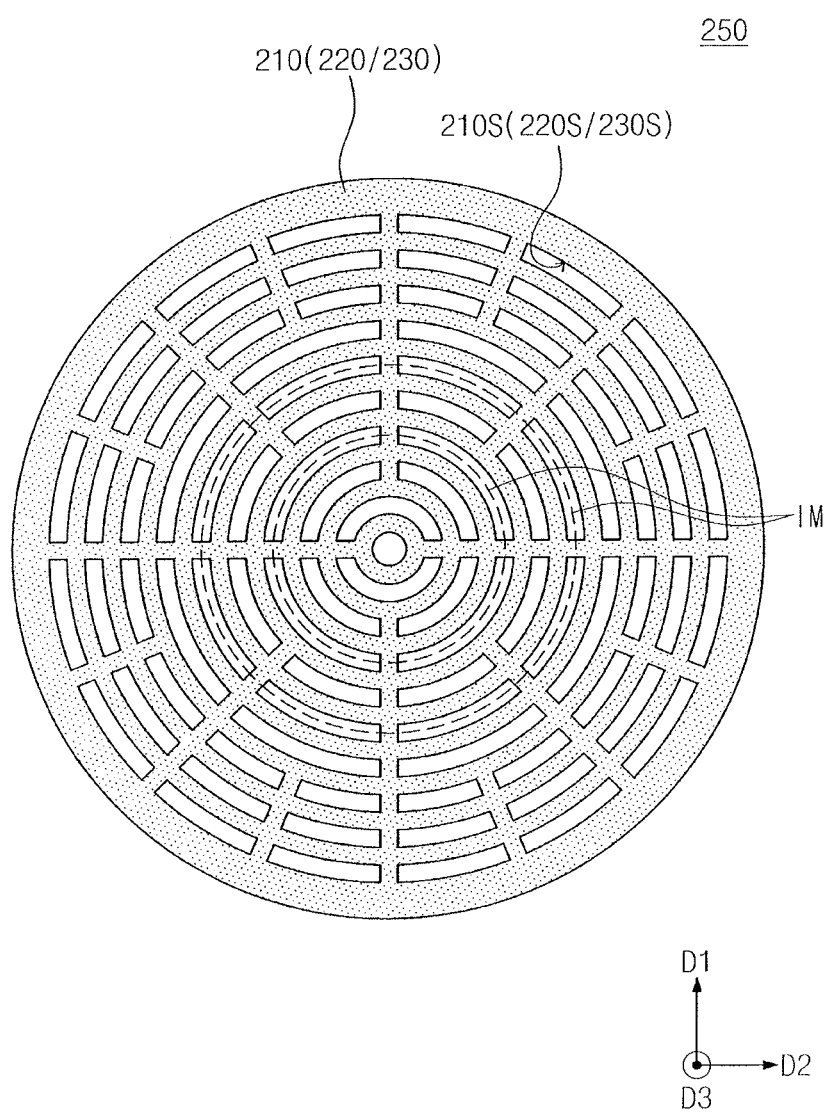
FIG. 12 illustrates a plan view of a modified example of a slit structure of the ion beam apparatus of FIG. 9.

FIG. 12 is a plan view illustrating a modified example of a slit structure of the ion beam apparatus of FIG. 9. Except for planar shapes and arrangement of slits, other features of a slit structure according to the present modified example may be substantially the same as corresponding features of the slit structure 250 described with reference to FIG. 11.

Referring to FIGS. 11 and 12, the slit structure 250 according to the present modified example may include a first electrode plate 210 having a plurality of first slits 210S, a second electrode plate 220 having a plurality of second slits 220S, and a third electrode plate 230 having a plurality of third slits 230S. The first to third electrode plates 210, 220 and 230 may vertically overlap with each other (i.e., in the third direction D3). At least one of the plurality of first slits 210S may have a curved line shape when viewed in a plan view. For example, as illustrated in FIG. 12, a plurality of imaginary circles IM may be provided on the first electrode plate 210, and the first slits 210S may be arranged along the circumference of each of the imaginary circles IM. Likewise, a plurality of imaginary circles IM may be provided on the second electrode plate 220 (or the third electrode plate 230), and the second slits 220S (or the third slits 230S) may be arranged along the circumference of each of the imaginary circles IM. Each of the third slits 230S may vertically overlap with a corresponding one of the first slits 210S and a corresponding one of the second slits 220S (i.e., in the third direction D3).

In the ion beam apparatus according to some embodiments, the ion beam may be irradiated to the surface of the substrate through the slit having the line shape extending in one direction. Thus, the beam divergence of the ion beam may be inhibited. In the case in which the ion beam apparatus includes the slit structure having the plate part and at least one electrode structure penetrating the plate part, the substrate may be disposed in such a way that the upper surface of the substrate is parallel to one flat surface of the plate part. Thus, a chamber volume of the ion beam apparatus may be reduced or minimized. In addition, the at least one electrode structure may rotate to easily control the incident direction and the incident angle of the ion beam.

Figure 13:
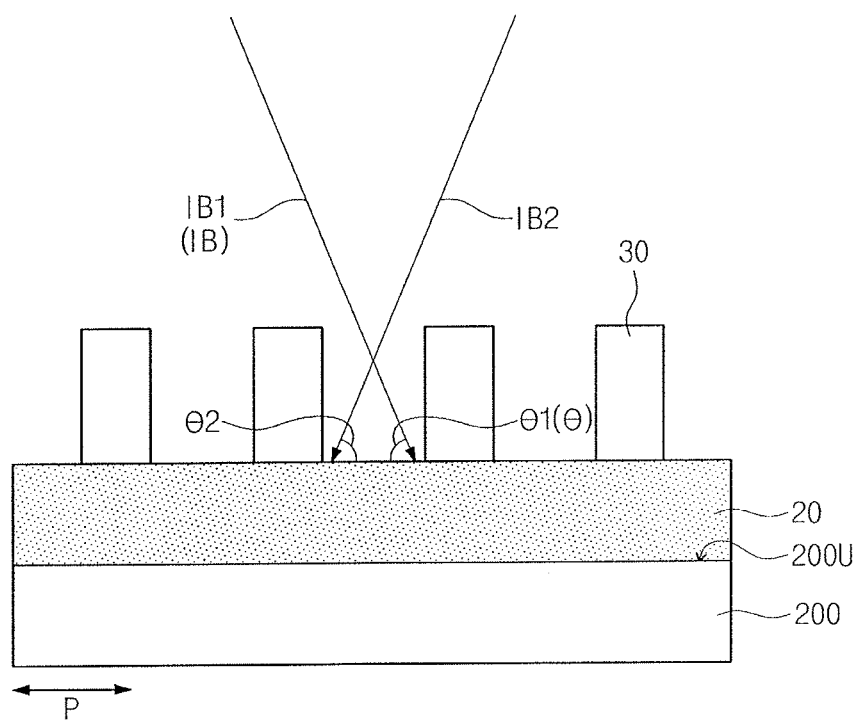
FIGS. 13 to 15 illustrate cross-sectional views of stages in an etching method using the ion beam apparatus according to some embodiments.
Figure 14:
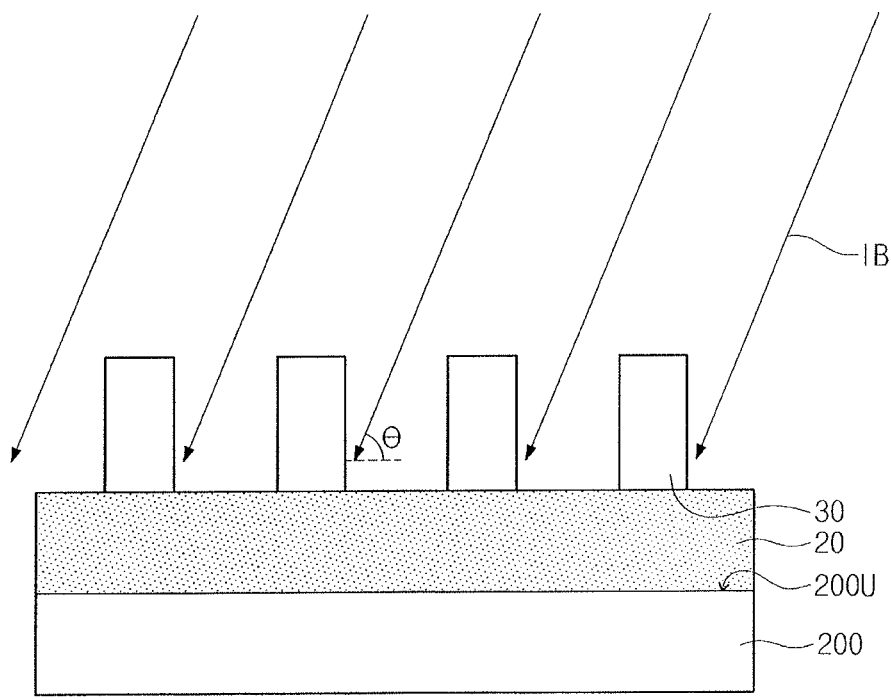
Figure 15:
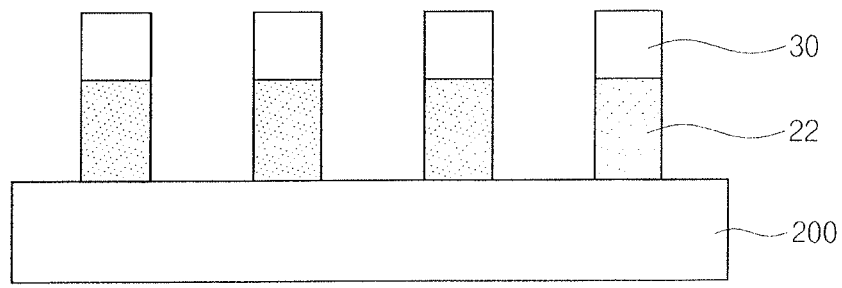

FIGS. 13 to 15 are cross-sectional views illustrating stages in an etching method using the ion beam apparatus according to some embodiments.

Referring to FIGS. 13 and 14, an etch target 20 may be formed on a substrate 200. The substrate 200 may include a semiconductor substrate, and the etch target 20 may include a conductive layer and/or an insulating layer. Mask patterns 30 may be formed on the etch target 20. The mask patterns 30 may include a conductive material and/or an insulating material.

In some embodiments, referring to FIG. 13, the substrate 200 having the mask patterns 30 may be provided into the ion beam apparatus 1000 described with reference to FIG. 1, 5, or 7. The substrate 200 may be provided into the process part 120 of the ion beam apparatus 1000 and may be loaded on the stage 130. The slit structure 180 may be provided over the substrate 200. The substrate 200 may be disposed in such a way that the upper surface 200U of the substrate 200 is substantially parallel to the flat surface 170B of the plate part 170.

When the slit structure 180 includes one electrode structure 160 as illustrated in FIG. 1, the electrode structure 160 may extract an ion beam IB from the plasma generated in the source part 110 of the ion beam apparatus 1000, and the ion beam IB may be irradiated to the substrate 200 through the slit 160S of the electrode structure 160. The ion beam IB may be irradiated at a predetermined incident angle θ with respect to the upper surface 200U of the substrate 200 and the electrode structure 160 may rotate to adjust the incident angle θ of the ion beam IB.

When the slit structure 180 includes a plurality of electrode structures 160 as illustrated in FIGS. 5 and 7, each of the electrode structures 160 may extract the ion beam IB from the plasma generated in the source part 110 of the ion beam apparatus 1000. In this case, the ion beam IB may include a first ion beam IB1 irradiated to the substrate 200 through the slit 160S of the odd-numbered electrode structure 160 among the electrode structures 160, and a second ion beam IB irradiated to the substrate 200 through the slit 160S of the even-numbered electrode structure 160 among the electrode structures 160. Since the odd-numbered electrode structures 160 rotate in the directions opposite to the rotation directions of the even-numbered electrode structures 160, the first ion beam IB1 and the second ion beam IB2 may be symmetrically irradiated. The first ion beam IB1 may be irradiated at a first incident angle θ1 with respect to the upper surface 200U of the substrate 200, and the second ion beam IB2 may be irradiated at a second incident angle θ2 with respect to the upper surface 200U of the substrate 200. A magnitude of the first incident angle θ1 may be equal to a magnitude of the second incident angle θ2, and the first ion beam IB1 and the second ion beam IB2 may be bilaterally symmetrically irradiated.

An etching process using the ion beam IB (or the first and second ion beams IB1 and IB2) may be performed on the substrate 200. The mask patterns 30 may be used as etch masks during the etching process. During the etching process, the stage 130 may change a horizontal position of the substrate 200 along a direction (i.e., the P-direction) parallel to the upper surface 200U of the substrate 200, as illustrated in FIGS. 1, 5, and 7. Thus, the ion beam IB (or the first and second ion beams IB1 and IB2) may scan the upper surface 200U of the substrate 200 along the P-direction. In addition, during the etching process, the stage 130 may rotate the substrate 200 on a rotation axis perpendicular to the upper surface 200U of the substrate 200.

In certain embodiments, referring to FIG. 14, the substrate 200 having the mask patterns 30 may be provided into the ion beam apparatus 1100 described with reference to FIG. 9. The substrate 200 may be provided into the process part 120 of the ion beam apparatus 1100 and may be loaded on the stage 130. The stage 130 may have the tilt angle θt with respect to the plane S, and thus the substrate 200 may be disposed in such a way that the upper surface 200U of the substrate 200 is tilted with respect to the plane S. The slit structure 250 may be provided over the substrate 200. The slit structure 250 may include the first to third electrode plates 210, 220, and 230. An ion beam IB may be extracted from the plasma, which is generated in the source part 110 of the ion beam apparatus 1100, by the first to third electrode plates 210, 220, and 230. The ion beam IB may be irradiated to the substrate 200 through the first to third slits 210S, 220S, and 230S of the first to third electrode plates 210, 220, and 230. The incident angle θ of the ion beam IB may be adjusted by adjusting the tilt angle θt of the stage 130.

An etching process using the ion beam IB may be performed on the substrate 200. The mask patterns 30 may be used as etch masks during the etching process. As described with reference to FIG. 9, the stage 130 may rotate the substrate 200 on a rotation axis perpendicular to the upper surface 200U of the substrate 200 during the etching process.

Referring to FIG. 15, the etching process using the ion beam IB (or the first and second ion beams IB1 and IB2) may be performed to form patterns 22 on the substrate 200.

In the etching method according to some embodiments, the ion beam may be irradiated to the substrate through the slit having the line shape extending in one direction. Thus, the beam divergence of the ion beam may be inhibited. As a result, a beam flux of the ion beam irradiated to the surface of the etch target on the substrate may be increased to improve the process capability of the etching process of patterning the etch target by using the ion beam. When the slit structure provided over the substrate includes at least one electrode structure, the at least one electrode structure may rotate to easily control the incident direction and the incident angle of the ion beam.

FIGS. 16 to 19 are cross-sectional views illustrating stages in a method for manufacturing a magnetic memory device using the ion beam apparatus according to some embodiments. FIGS. 20A and 20B are cross-sectional views illustrating magnetic tunnel junction patterns according to some embodiments.

Figure 16:
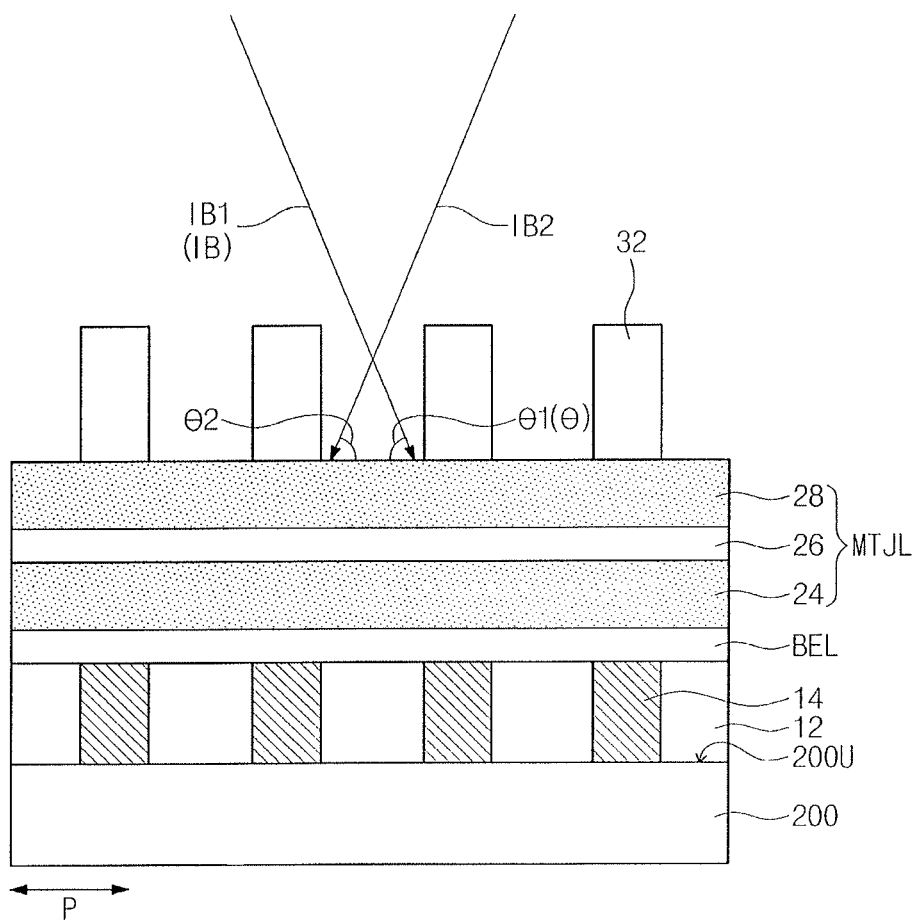
FIGS. 16 to 19 illustrate cross-sectional views of stages in a method for manufacturing a magnetic memory device using the ion beam apparatus according to some embodiments.
Figure 17:
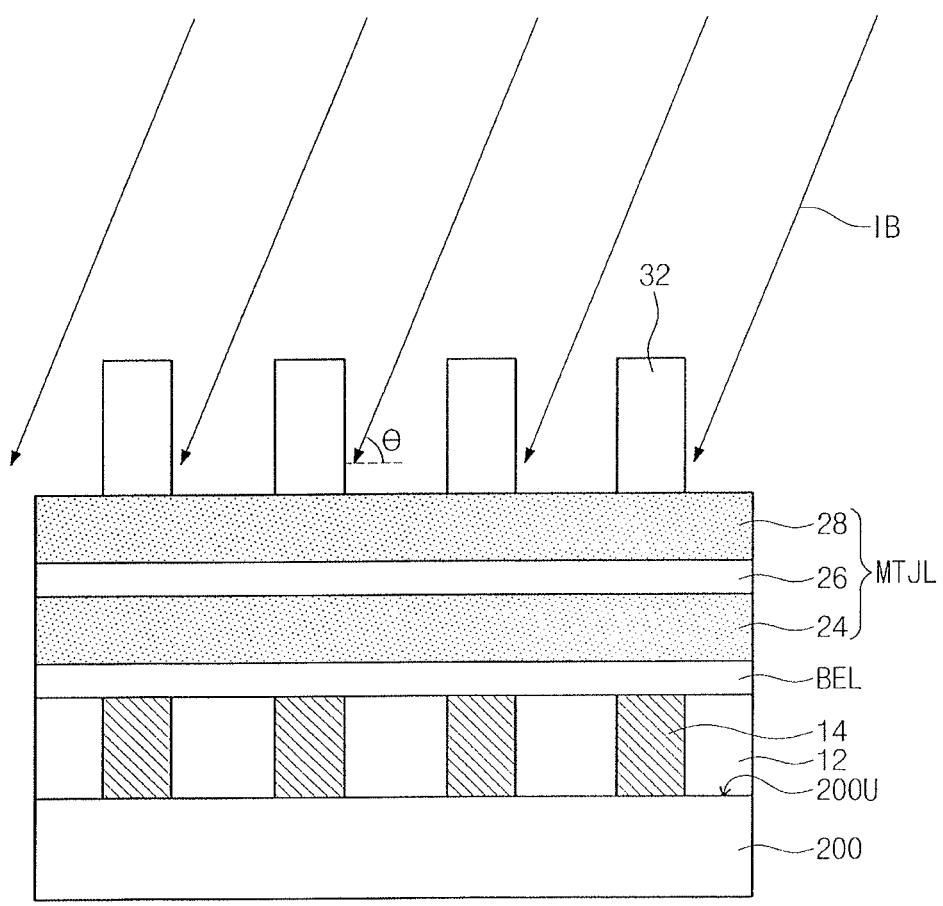

Referring to FIGS. 16 and 17, a lower interlayer insulating layer 12 may be formed on a substrate 200. The substrate 200 may include a semiconductor substrate. For example, the substrate 200 may include a silicon substrate, a germanium substrate, or a silicon-germanium substrate. Switching elements (not shown) may be formed on the substrate 200, and the lower interlayer insulating layer 12 may be formed to cover the switching elements. The switching elements may be field effect transistors. Alternatively, the switching elements may be diodes. The lower interlayer insulating layer 12 may be formed of a single layer or multi-layer including at least one of an oxide layer (e.g., a silicon oxide layer), a nitride layer (e.g., a silicon nitride layer), or an oxynitride layer (e.g., a silicon oxynitride layer).

Lower contact plugs 14 may be formed in the lower interlayer insulating layer 12. Each of the lower contact plugs 14 may penetrate the lower interlayer insulating layer 12 so as to be electrically connected to one terminal of a corresponding one of the switching elements. The lower contact plugs 14 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

A bottom electrode layer BEL and a magnetic tunnel junction layer MTJL may be sequentially formed on the lower interlayer insulating layer 12. The bottom electrode layer BEL may include a conductive metal nitride such as titanium nitride and/or tantalum nitride. In some embodiments, the bottom electrode layer BEL may include a material (e.g., ruthenium (Ru)) capable of assisting crystal growth of magnetic layers included in the magnetic tunnel junction layer MTJL. The magnetic tunnel junction layer MTJL may include a first magnetic layer 24, a tunnel barrier layer 26 and a second magnetic layer 28 which are sequentially stacked on the bottom electrode layer BEL. One of the first and second magnetic layers 24 and 28 may correspond to a reference layer having a magnetization direction fixed in one direction, and the other of the first and second magnetic layers 24 and 28 may correspond to a free layer having a magnetization direction changeable to be parallel or anti-parallel to the fixed magnetization direction of the reference layer.

In some embodiments, the magnetization directions of the reference layer and the free layer may be substantially perpendicular to an interface between the tunnel barrier layer 26 and the second magnetic layer 28. In this case, each of the reference layer and the free layer may include at least one of a perpendicular magnetic material (e.g., cobalt iron terbium (CoFeTb), cobalt iron gandolinium (CoFeGd), or cobalt iron dysprosium (CoFeDy)), a perpendicular magnetic material having a L10 lattice structure, a cobalt platinum (CoPt) alloy having a hexagonal close packed (HCP) lattice structure, or a perpendicular magnetic structure. The perpendicular magnetic material having the L10 lattice structure may include at least one of an iron platinum (FePt) having the L10 lattice structure, iron palladium (FePd) having the L10 lattice structure, cobalt palladium (CoPd) having the L10 lattice structure, or CoPt having the L10 lattice structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. Here, the reference layer may be thicker than the free layer, and/or a coercive force of the reference layer may be greater than a coercive force of the free layer.

In certain embodiments, the magnetization directions of the reference layer and the free layer may be substantially parallel to the interface between the tunnel barrier layer 26 and the second magnetic layer 28. In this case, each of the reference layer and the free layer may include a ferromagnetic material. The reference layer may further include an anti-ferromagnetic material for fixing a magnetization direction of the ferromagnetic material included in the reference layer.

The tunnel barrier layer 26 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

Conductive mask patterns 32 may be formed on the magnetic tunnel junction layer MTJL. The conductive mask patterns 32 may define regions in which magnetic tunnel junction patterns will be formed. For example, the conductive mask patterns 32 may include at least one of tungsten, titanium, tantalum, aluminum, or a metal nitride (e.g., titanium nitride or tantalum nitride).

In some embodiments, referring to FIG. 16, the substrate 200 having the conductive mask patterns 32 may be provided into the ion beam apparatus 1000 described with reference to FIG. 1, 5, or 7. The substrate 200 may be provided into the process part 120 of the ion beam apparatus 1000 and may be loaded on the stage 130. The slit structure 180 may be provided over the substrate 200. The substrate 200 may be disposed in such a way that a upper surface 200U of the substrate 200 is substantially parallel to the flat surface 170B of the plate part 170.

When the slit structure 180 includes one electrode structure 160 as illustrated in FIG. 1, the electrode structure 160 may extract an ion beam IB from the plasma generated in the source part 110 of the ion beam apparatus 1000, and the ion beam IB may be irradiated to the substrate 200 through the slit 160S of the electrode structure 160. The ion beam IB may be irradiated at a predetermined incident angle θ with respect to the upper surface 200U of the substrate 200, and the electrode structure 160 may rotate to adjust the incident angle θ of the ion beam IB.

When the slit structure 180 includes a plurality of electrode structures 160 as illustrated in FIGS. 5 and 7, each of the electrode structures 160 may extract the ion beam IB from the plasma generated in the source part 110 of the ion beam apparatus 1000. In this case, the ion beam IB may include a first ion beam IB1 irradiated to the substrate 200 through the slit 160S of the odd-numbered electrode structure 160 among the electrode structures 160, and a second ion beam IB irradiated to the substrate 200 through the slit 160S of the even-numbered electrode structure 160 among the electrode structures 160. Since the odd-numbered electrode structures 160 rotate in the directions opposite to the rotation directions of the even-numbered electrode structures 160, the first ion beam IB1 and the second ion beam IB2 may be symmetrically irradiated.

An etching process using the ion beam IB (or the first and second ion beams IB1 and IB2) may be performed on the substrate 200. The conductive mask patterns 32 may be used as etch masks during the etching process. The magnetic tunnel junction layer MTJL between the conductive mask patterns 32 may be etched by the ion beam IB (or the first and second ion beams IB1 and IB2) during the etching process. During the etching process, the stage 130 may change a horizontal position of the substrate 200 along a direction (i.e., the P-direction) parallel to the upper surface 200U of the substrate 200, as illustrated in FIGS. 1, 5, and 7. Thus, the ion beam IB (or the first and second ion beams IB1 and iB2) may scan the upper surface 200U of the substrate 200 along the P-direction. In addition, during the etching process, the stage 130 may rotate the substrate 200 on a rotation axis perpendicular to the upper surface 200U of the substrate 200.

In certain embodiments, referring to FIG. 17, the substrate 200 having the conductive mask patterns 32 may be provided into the ion beam apparatus 1100 described with reference to FIG. 9. The substrate 200 may be provided into the process part 120 of the ion beam apparatus 1100 and may be loaded on the stage 130. The stage 130 may have the tilt angle θt with respect to the plane S, and thus the substrate 200 may be disposed in such a way that the upper surface 200U of the substrate 200 is tilted with respect to the plane S. The slit structure 250 may be provided over the substrate 200. The slit structure 250 may include the first to third electrode plates 210, 220, and 230. An ion beam IB may be extracted from the plasma, which is generated in the source part 110 of the ion beam apparatus 1100, by the first to third electrode plates 210, 220, and 230. The ion beam IB may be irradiated to the substrate 200 through the first to third slits 210S, 220S, and 230S of the first to third electrode plates 210, 220, and 230. The incident angle θ of the ion beam IB may be adjusted by adjusting the tilt angle θt of the stage 130.

An etching process using the ion beam IB may be performed on the substrate 200. The conductive mask patterns 32 may be used as etch masks during the etching process. The magnetic tunnel junction layer MTJL between the conductive mask patterns 32 may be etched by the ion beam IB during the etching process. As described with reference to FIG. 9, the stage 130 may rotate the substrate 200 on a rotation axis perpendicular to the upper surface 200U of the substrate 200 during the etching process.

Figure 18:
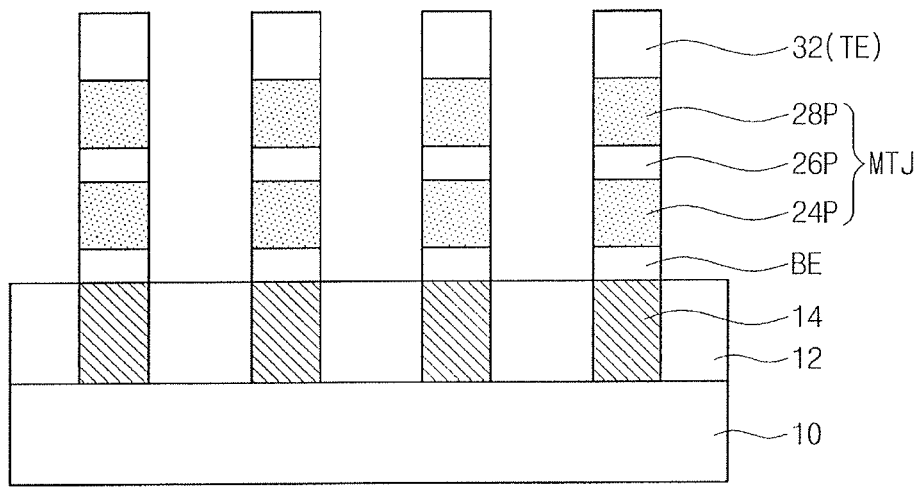

Referring to FIG. 18, the magnetic tunnel junction layer MTJL and the bottom electrode layer BEL may be sequentially etched by the etching process to form magnetic tunnel junction patterns MTJ and bottom electrodes BE. Each of the bottom electrodes BE may be formed on a corresponding one of the lower contact plugs 14 and may be electrically connected to the corresponding lower contact plug 14. The magnetic tunnel junction patterns MTJ may be formed on the bottom electrodes BE, respectively. Each of the magnetic tunnel junction patterns MTJ may be electrically connected to a corresponding lower contact plug 14 through a corresponding bottom electrode BE. The conductive mask patterns 32 may function as top electrodes TE. Each of the magnetic tunnel junction patterns MTJ may be provided between a corresponding top electrode TE and the corresponding bottom electrode BE.

Each of the magnetic tunnel junction patterns MTJ may include a first magnetic pattern 24P, a tunnel barrier pattern 26P and a second magnetic pattern 28P which are sequentially stacked on the corresponding bottom electrode BE. In some embodiments, as illustrated in FIG. 20A, magnetization directions 24a and 28a of the first and second magnetic patterns 24P and 28P may be substantially parallel to an interface between the tunnel barrier pattern 26P and the second magnetic pattern 28P. FIG. 20A illustrates an embodiment in which the first magnetic pattern 24P is a reference pattern and the second magnetic pattern 28P is a free pattern. However, embodiments are not limited thereto. Unlike FIG. 20A, the first magnetic pattern 24P may be the free pattern and the second magnetic pattern 28P may be the reference pattern. The reference pattern may be thicker than the free pattern, and/or a coercive force of the reference pattern may be greater than a coercive force of the free pattern. In certain embodiments, as illustrated in FIG. 20B, the magnetization directions 24a and 28a of the first and second magnetic patterns 24P and 28P may be substantially perpendicular to the interface between the tunnel barrier pattern 26P and the second magnetic pattern 28P. FIG. 20B illustrates an embodiment in which the first magnetic pattern 24P is the reference pattern and the second magnetic pattern 28P is the free pattern. However, embodiments are not limited thereto. Unlike FIG. 20B, the first magnetic pattern 24P may be the free pattern and the second magnetic pattern 28P may be the reference pattern.

Figure 19:
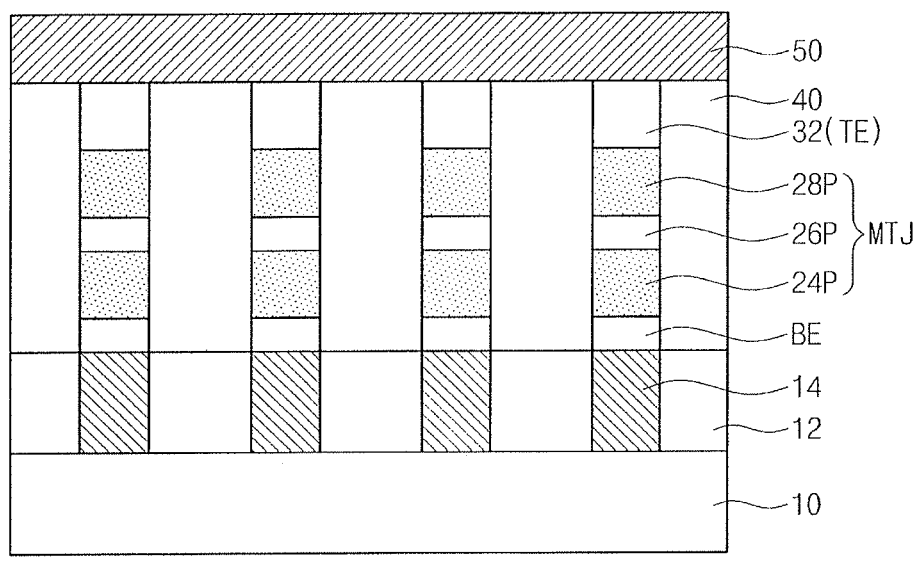
Figure 20A:
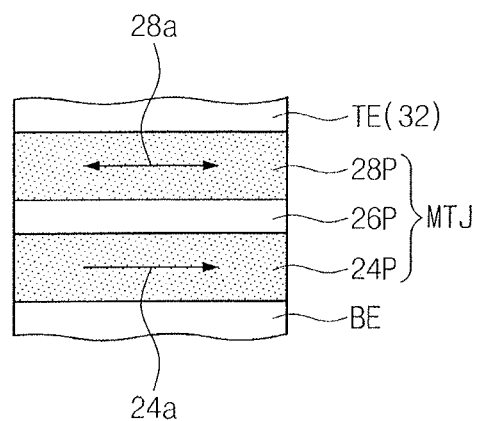
FIG. 20A illustrates a cross-sectional view of a magnetic tunnel junction pattern according to some embodiments.
Figure 20B:
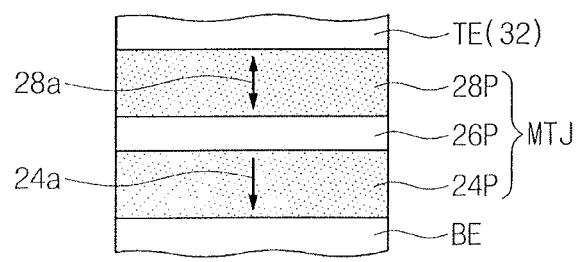
FIG. 20B illustrates a cross-sectional view of a magnetic tunnel junction pattern according to some embodiments.

Referring to FIG. 19, an upper interlayer insulating layer 40 may be formed on the lower interlayer insulating layer 12 to cover the bottom electrodes BE, the magnetic tunnel junction patterns MTJ, and the top electrodes TE. The upper interlayer insulating layer 40 may include at least one of an oxide layer (e.g., a silicon oxide layer), a nitride layer (e.g., a silicon nitride layer), or an oxynitride layer (e.g., silicon oxynitride layer). An interconnection line 50 may be formed on the upper interlayer insulating layer 40. The interconnection line 50 may extend in one direction and may be electrically connected to a plurality of the magnetic tunnel junction patterns MTJ arranged in the one direction. Each of the magnetic tunnel junction patterns MTJ may be electrically connected to the interconnection line 50 through the corresponding top electrode TE. The interconnection line 50 may function as a bit line.

Figure 21:
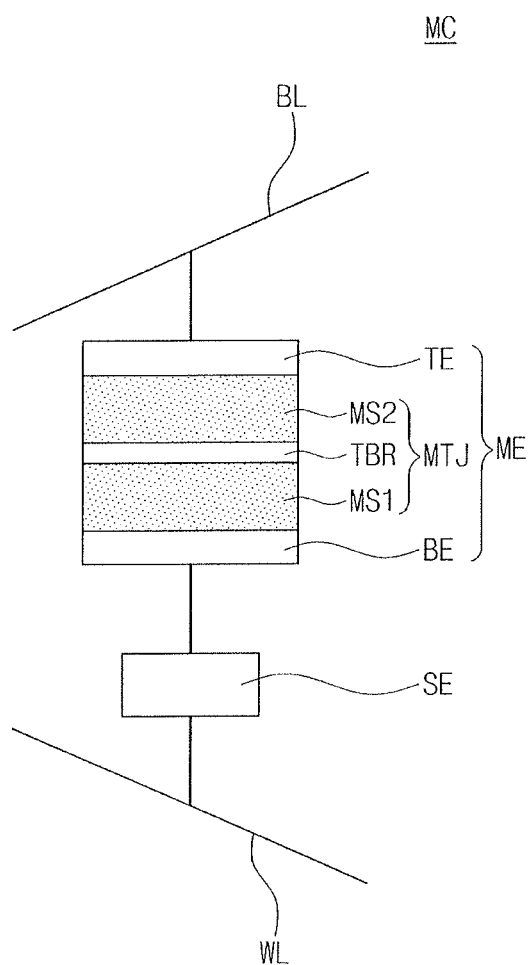
FIG. 21 illustrates a circuit diagram of a unit memory cell of a magnetic memory device manufactured using the manufacturing method according to some embodiments.

FIG. 21 is a circuit diagram illustrating a unit memory cell of a magnetic memory device manufactured using the manufacturing method according to some embodiments.

Referring to FIG. 21, a unit memory cell MC may include a memory element ME and a selection element SE. The memory element ME may be connected between a bit line BL and the selection element SE, and the selection element SE may be connected between the memory element ME and a word line WL. The memory element ME may be a variable resistance element of which a resistance state is switchable between two different resistance states by an electrical pulse applied thereto. The memory element ME may have a thin-layer structure of which an electrical resistance is changeable using spin transfer torque of electrons of a program current passing therethrough. The memory element ME may have a thin-layer structure showing a magnetoresistance characteristic and may include at least one ferromagnetic material and/or at least one anti-ferromagnetic material. The selection element SE may selectively control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line may be connected to the selection element SE.

The memory element ME may include a first magnetic structure MS1, a second magnetic structure MS2, and a tunnel barrier TBR between the first and second magnetic structures MS1 and MS2. The first magnetic structure MS1, the second magnetic structure MS2, and the tunnel barrier TBR may constitute a magnetic tunnel junction pattern MTJ. Each of the first and second magnetic structures MS1 and MS2 may include at least one magnetic layer formed of a magnetic material. The memory element ME may further include a bottom electrode BE between the first magnetic structure MS1 and the selection element SE, and a top electrode TE between the second magnetic structure MS2 and the bit line BL.

In the method for manufacturing the magnetic memory device according to some embodiments, the ion beam may be irradiated to the substrate through the slit having the line shape extending in one direction, and thus the beam divergence of the ion beam may be inhibited. As a result, a beam flux of the ion beam irradiated to the surface of the magnetic tunnel junction layer on the substrate may be increased to improve the process capability of the etching process of patterning the magnetic tunnel junction layer by using the ion beam. In addition, when the slit structure provided over the substrate includes at least one electrode structure, the at least one electrode structure may rotate to easily control the incident direction and the incident angle of the ion beam.

According to some embodiments, the ion beam apparatus may include the slit structure including the slit having a line shape extending in one direction. Since the ion beam is irradiated to the surface of the substrate through the slit having the line shape, the beam divergence of the ion beam may be inhibited. Thus, the beam flux of the ion beam irradiated to the surface of the etch target (e.g., the magnetic tunnel junction layer) on the substrate may be increased to improve the process capability of the etching process of patterning the etch target (e.g., the magnetic tunnel junction layer) by using the ion beam.

The slit structure may include the plate part and at least one electrode structure penetrating the plate part, and the electrode structure may include the slit passing therethrough. The flat surface of the plate part may be parallel to the upper surface of the substrate. Thus. the chamber volume of the ion beam apparatus may be reduced or minimized. In addition, the at least one electrode structure may rotate to easily control the incident direction and the incident angle of the ion beam.

Embodiments may provide an ion beam apparatus that may reduce or minimize beam divergence.

Embodiments may also provide an ion beam apparatus that may reduce or minimize a chamber volume and that may readily control an incident direction and an incident angle of an ion beam.

Embodiments may further provide an etching method and a method for manufacturing a magnetic memory device, having an improved process capability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An ion beam apparatus, comprising:
a source part generating plasma;
a process part in which a process using an ion beam is performed;
a slit structure between the source part and the process part, the slit structure extracting the ion beam from the plasma, and the slit structure including:
an electrode plate, and
a plurality of slits through the electrode plate, each of the plurality of slits having a line shape with a longer length in a first direction than its width in a second direction when viewed in a plan view, some slits of the plurality of slits having decreasing lengths along the first direction as a distance from a center of the electrode plate along the second direction increases, and a length of at least some of the plurality of slits along the first direction being longer than half a length of the electrode plate along the first direction; and
a stage in the process part, a substrate to be loaded on the stage, wherein
the ion beam is irradiated onto the substrate at an incident angle through the plurality of slits,
the stage is provided to have a tilt angle with respect to a flat surface of the electrode plate, and
the incident angle of the ion beam is adjusted by adjusting the tilt angle of the stage.

2. The ion beam apparatus as claimed in claim 1, wherein:
each of the plurality of slits has a straight line shape extending in the first direction when viewed in the plan view, and
the plurality of slits are arranged in the second direction intersecting the first direction when viewed in the plan view.

3. The ion beam apparatus as claimed in claim 1, wherein:
the electrode plate is a first electrode plate and the plurality of slits is a plurality of first slits,
the slit structure further includes a second electrode plate vertically overlapping the first electrode plate and having a plurality of second slits,
each of the plurality of second slits vertically overlaps a corresponding one of the plurality of first slits,
the ion beam is irradiated onto the substrate through the plurality of first slits and the plurality of second slits, and
a first voltage applied to the first electrode plate is different from a second voltage applied to the second electrode plate.

4. The ion beam apparatus as claimed in claim 3, wherein:
the slit structure further includes a third electrode plate vertically overlapping the first electrode plate and having a plurality of third slits,
the second electrode plate is between the first electrode plate and the third electrode plate,
each of the plurality of third slits vertically overlaps corresponding ones of the plurality of first slits and the plurality of second slits,
the ion beam is irradiated onto the substrate through the plurality of first slits, the plurality of second slits, and the plurality of third slits, and
a third voltage applied to the third electrode plate is different from the first voltage and the second voltage.

5. The ion beam apparatus as claimed in claim 1, wherein the electrode plate is an electric conductor.

6. The ion beam apparatus as claimed in claim 1, wherein the source part, the process part, and the slit structure are inside a same chamber.

7. The ion beam apparatus as claimed in claim 6, wherein the electrode plate of the slit structure has a circular plane shape when viewed in a plan view.

* * * * *